(12) United States Patent
Kim et al.

(10) Patent No.: US 9,123,818 B2
(45) Date of Patent: Sep. 1, 2015

(54) COMPOSITIONS FOR SOLUTION PROCESS, ELECTRONIC DEVICES FABRICATED USING THE SAME, AND FABRICATION METHODS THEREOF

(75) Inventors: Hyun Jae Kim, Seoul (KR); Woong Hee Jeong, Seoul (KR); Byung Du Ahn, Seoul (KR); Gun Hee Kim, Seoul (KR)

(73) Assignee: Industry-Academic Cooperation Foundation, Yonsei University, Seoul (KR)

(*) Notice: Subject to any disclaimer, the term of this patent is extended or adjusted under 35 U.S.C. 154(b) by 662 days.

(21) Appl. No.: 13/322,193

(22) PCT Filed: May 24, 2010

(86) PCT No.: PCT/KR2010/003266
§ 371 (c)(1),
(2), (4) Date: Nov. 23, 2011

(87) PCT Pub. No.: WO2010/137838
PCT Pub. Date: Dec. 2, 2010

(65) Prior Publication Data
US 2012/0080678 A1     Apr. 5, 2012

(30) Foreign Application Priority Data

May 26, 2009  (KR) .................. 10-2009-0046001
Sep. 29, 2009  (KR) .................. 10-2009-0092635

(51) Int. Cl.
| | | |
|---|---|---|
| H01L 29/786 | (2006.01) | |
| B82Y 10/00 | (2011.01) | |
| H01L 29/06 | (2006.01) | |
| H01L 27/12 | (2006.01) | |

(52) U.S. Cl.
CPC ............ *H01L 29/7869* (2013.01); *B82Y 10/00* (2013.01); *H01L 29/0665* (2013.01); *H01L 29/0673* (2013.01); *H01L 27/1225* (2013.01)

(58) Field of Classification Search
CPC ............ H01L 29/7869; H01L 27/1225; H01L 29/0665; H01L 29/0673
USPC ............. 257/57, E21.411, E29.273; 438/158; 264/234
See application file for complete search history.

(56) References Cited

FOREIGN PATENT DOCUMENTS

| | | |
|---|---|---|
| JP | 2001-244464 A | 9/2001 |
| JP | 2005-514729 A | 5/2005 |
| JP | 2008-294136 A | 12/2008 |
| KR | 10-0502821 B1 | 7/2005 |
| KR | 10-2007-0033508 A | 3/2007 |
| KR | 10-2008-0030454 A | 4/2008 |
| KR | 10-2008-0104292 A | 12/2008 |
| KR | 10-0876947 B1 | 1/2009 |

OTHER PUBLICATIONS

International Search Report for Appl. No. PCT/KR2010/003266 mailed Jan. 14, 2011.

(Continued)

*Primary Examiner* — Selim Ahmed
(74) *Attorney, Agent, or Firm* — Carter, DeLuca, Farrell & Schmidt, LLP

(57) ABSTRACT

Exemplary embodiments provide compositions for a solution process, electronic devices fabricated using the same, and fabrication methods thereof. An oxide nano-structure is formed using a sol-gel process. An oxide thin film transistor is formed using the oxide nano-structure.

26 Claims, 14 Drawing Sheets

(56) References Cited

OTHER PUBLICATIONS

D. C. Look, "Recent advances in ZnO materials and devices", Materials Science and Engineering, B80, pp. 383-387, (2001).

Ma et al., "Structural, electrical, and optical properties of transparent conductive ZnO:Ga films prepared by DC reactive magnetron sputtering", Journal of Crystal Growth, 304, pp. 64-68 (2007).

Oh et al., "Properties of transparent conductive ZnO:Al films prepared by co-sputtering", Journal of Crystal Growth, vol. 274, pp. 453-457, (2005).

Luna-Arredondo et al., "Indium-doped ZnO thin films deposited by the sol-gel technique", Thin Solid Films, 490, pp. 132-136 (2005).

Look et al, "Electrical properties of bulk ZnO", Solid State Commun. 105, pp. 399-401 (1998).

Lauhon et al., "Epitaxial core-shell and core-multishell nanowire heterostructures", Nature, 420, pp. 57-61, (2002).

Xia et al., "One Dimensional Nanostructures : Synthesis, Characterization, and Applications", Advanced Materials, 15, No. 5, pp. 353-389, (2003).

Lu et al., "Growth of Single Crystal Silicon Nanowires in Supercritical Silution from Tethered Gold Particles on a Silicon Substrate", Nano Letters, 3, No. 1, pp. 93-99, (2003).

Surface Treatment

Thermal Treatment

COMPOSITIONS FOR SOLUTION PROCESS, ELECTRONIC DEVICES FABRICATED USING THE SAME, AND FABRICATION METHODS THEREOF

TECHNICAL FIELD

The exemplary embodiments disclosure herein relate to compositions for a solution process, electronic devices fabricated using the compositions, and fabrication methods thereof. More particularly, the present disclosure herein relates to oxide nano-structures, oxide thin film transistors, oxide semiconductor devices and fabrication methods thereof.

Oxide thin film transistors and methods of fabricating the same using a sol-gel process have been proposed as one of national projects that are performed by the Ministry of Education, Science and Technology and the Korea Science and Engineering Foundation [Project Ref. No.: 2008-8-0878, Title of the Project: Technology Development to Solution Based Silicon (SBS) thin films for Next Generation Displays and to All Solution Based (ASB) Thin Film Transistors]

BACKGROUND ART

Recently, oxide thin films have been widely used in displays and semiconductor devices. A zinc oxide (ZnO) material of the oxide thin films is a II-VI group compound semiconductor material having a direct transition characteristic. Further, the zinc oxide (ZnO) material has high band gap energy of about 3.37 electron volts (eV). Thus, the zinc oxide (ZnO) material may be transparent to visible rays and may be widely used in photo devices {see an article by D. C. Look et al., entitled "Recent advances in ZnO material and devices", Material Science and Engineering, B 80, 383 (2001)}.

The ZnO material may exhibit an N-type characteristic due to interstitial zinc atoms and native defects (e.g., oxygen vacancies), and the electrical resistivity of the ZnO material may vary within the range of about $1 \times 10^{-2}$ Ωcm to about $1 \times 10^{10}$ Ωcm according to a process condition. The ZnO material may be used as a transparent electrode by doping the ZnO material with N-type impurities to increase the electron concentration thereof. The N-type impurities may include III-group elements or VII-group elements. For example, the typical III-group elements may be gallium (Ga) atoms, aluminum (Al) atoms or indium (In) atoms. The ZnO material doped with gallium (Ga) atoms may be referred to as a gallium zinc oxide (GZO) material {see an article by Quan-Bao et al., entitled "Structural, electrical and optical properties of transparent conductive ZnO:Ga films prepared by DC reactive magnetron sputtering", Journal of Crystal Growth, 304, 64 (2007)}, and the ZnO material doped with aluminum (Al) atoms may be referred to as an aluminum zinc oxide (AZO) material {see an article by Byeong-Yun Oh et al., entitled "Properties of transparent conductive ZnO:Al films prepared by co-sputtering", Journal of Crystal Growth, Volume 274, 453 (2005)}. Further, the ZnO material doped with indium (In) atoms may be referred to as an indium zinc oxide (IZO) material {see an article by Luna-Arredondo et al., entitled "Indium-doped ZnO thin films deposited by the sol-gel technique", Thin Solid Films, 490, 132 (2005)}.

The above transparent conductive materials (e.g., transparent electrodes) may be very attractive as candidates of the transparent indium tin oxide (ITO) material well known in the art.

The transparency of the zinc oxide material may provide the possibility of fabrication of transparent transistors. Further, the zinc oxide material may be suitable for an active layer of the thin film transistors since the zinc oxide material provides a high mobility of carriers. The zinc oxide material may exhibit an excellent carrier mobility of about 200 cm$^2$/Vs in a bulk region thereof {see an article by D. C. Look et al., entitled "Electrical properties of bulk ZnO", Solid State Commun., 105, 399 (1998)}. In addition, zinc compound materials may be formed by an ionic bond. Thus, a difference between the mobility of the crystalline zinc compound material and the mobility of the amorphous zinc compound material may be relatively less as compared with a silicon material. Thus, the zinc oxide material may be very suitable for the display devices that require the active layer having a high mobility. Furthermore, a zinc alloy material including the zinc compound material and other elements has been proposed to obtain high mobility and stability in the active layer. For example, at least one of materials (e.g., indium, tin and thallium) having an orbital 5 s or the higher orbital (e.g., having a greater ion radius than zinc) may be added to the zinc compound material, thereby forming the zinc alloy material such as an indium-gallium-zinc oxide (In—Ga—ZnO; IGZO) material, an indium-zinc oxide (In—ZnO; IZO) material, a tin-zinc oxide (Sn—ZnO; SZO) material, a tin-gallium-zinc oxide (Sn—Ga—ZnO; SGZO) material, an indium-tin-zinc oxide (In—Sn—ZnO; ISZO) material, a thallium-zinc oxide (Tl—ZnO; TZO) material or a thallium-gallium-zinc oxide (Tl—Ga—ZnO; TGZO) material. These zinc alloy materials have a greater positive ion than the zinc material. That is, the number of peripheral electrons of the alloy materials may be greater than that of peripheral electrons of the zinc material. The peripheral electrons may contribute to the electron mobility. Thus, the electron mobility of the zinc alloy materials may be greater than that of the zinc material. The gallium atoms in the zinc alloy materials (e.g., active layers) may control the electrical characteristics thereof and may improve stability thereof. Recently, a study on the IGZO material has been increasingly demanded to apply the IGZO material to the display devices. The IGZO material may be formed using a pulsed laser deposition (PLD) process, a sputtering process or a chemical vapor deposition (CVD) process. These processes may be performed using an apparatus including a vacuum chamber. Thus, when the IGZO material is formed using the vacuum process, fabrication cost may be increased.

DISCLOSURE OF INVENTION

Some embodiments provide methods of fabricating a thin film transistor without use of a photolithography process and methods of fabricating an electronic device using a sol-gel process which is capable of obtaining a thin film having a desired composition.

Some embodiments provide methods of fabricating a plurality of thin film transistors on a substrate having a large area.

Some embodiments provide methods of fabricating an oxide semiconductor device having nano-structures which are less contaminated, using a fabrication process of nano-structures and a sol-gel process with low cost.

Some embodiments provide oxide semiconductor devices having nano-structures which are less contaminated.

Some embodiments provide methods of more efficiently forming a metal oxide material of a multi-component system by introducing an oxide material into a porous nano-structure using a sol-gel process as a base process to obtain an oxide nano-structure.

Some embodiments provide methods of forming an oxide nano-structure having a desired size, a desired composition and a desired phase using a sol-gel process and a porous nano-structure.

In an exemplary embodiment, the method of fabricating an electronic device includes preparing one oxide material sol solution selected from the group consisting of an oxide semiconductor based sol solution, an oxide insulator based sol solution and an oxide conductor based sol solution, supplying the prepared sol solution onto a surface of a print roll to form a sol pattern, rolling the print roll along a substrate to transfer the sol pattern from the print roll onto the substrate, and drying and heating the sol pattern transferred on the substrate to form a thin film pattern on the substrate.

The thin film pattern may be one of an oxide semiconductor layer, an oxide insulator layer and an oxide conductor layer. The sol pattern transferred on the substrate may be dried and heated at a temperature of about 300° C. to about 1000° C.

The method may further include applying a surface treatment process to a surface of the substrate to change the surface of the substrate into a hydrophilic surface or a hydrophobic surface before the print roll is rolled along the substrate.

Preparing the oxide material sol solution may include mixing at least one dispersoid selected from the group consisting of a zinc compound, an indium compound, a gallium compound, a tin compound, a hafnium compound, a zirconium compound, a magnesium compound, an yttrium compound and a thallium compound in a dispersion medium corresponding to the selected dispersoid to form a disperse system, stirring the disperse system, and aging the stirred disperse system. The dispersoid may be obtained by mixing the zinc compound and a non-zinc compound in a mole ratio of about 1:0.1 to about 1:2. The non-zinc compound may include at least one selected from the group consisting of the indium compound, the gallium compound, the tin compound, the hafnium compound, the zirconium compound, the magnesium compound, the yttrium compound and the thallium compound.

The dispersion medium may include at least one selected from the group consisting of isopropanol, 2-methoxyethanol, dimethylformamide, ethanol, de-ionized water, methanol, acetylacetone, dimethylamineborane and acetonitrile.

The zinc compound may include at least one selected from the group consisting of zinc citrate dihydrate, zinc acetate, zinc acetate dihydrate, zinc acetylacetonate hydrate, zinc acrylate, zinc chloride, zinc diethyldithiocarbamate, zinc dimethyldithiocarbamate, zinc fluoride, zinc fluoride hydrate, zinc hexafluoroacetylacetonate dihydrate, zinc methacrylate, zinc nitrate hexahydrate, zinc nitrate hydrate, zinc trifluoromethanesulfonate, zinc undecylenate, zinc trifluoroacetate hydrate, zinc tetrafluoroborate hydrate and zinc perchlorate hexahydrate.

The indium compound may include at least one selected from the group consisting of indium chloride, indium chloride tetrahydrate, indium fluoride, indium fluoride trihydrate, indium hydroxide, indium nitrate hydrate, indium acetate hydrate, indium acetylacetonate and indium acetate.

The gallium compound may include at least one selected from the group consisting of gallium acetylacetonate, gallium chloride, gallium fluoride and gallium nitrate hydrate.

The tin compound may include at least one selected from the group consisting of tin acetate, tin chloride, tin chloride dihydrate, tin chloride pentahydrate and tin fluoride.

The thallium compound may include at least one selected from the group consisting of thallium acetate, thallium acetylacetonate, thallium chloride, thallium chloride tetrahydrate, thallium cyclopentadienide, thallium fluoride, thallium formate, thallium hexafluoroacetylacetonate, thallium nitrate, thallium nitrate trihydrate, thallium trifluroacetate and thallium perchlorate hydrate.

The hafnium compound may include at least one selected from the group consisting of hafnium chloride and hafnium fluoride.

The magnesium compound may include at least one selected from the group consisting of magnesium acetate, magnesium chloride, magnesium nitrate hydrate and magnesium sulfate.

The zirconium compound may include at least one selected from the group consisting of zirconium acetate, zirconium acetylacetonate, zirconium chloride and zirconium fluoride.

The yttrium compound may include at least one selected from the group consisting of yttrium acetate, yttrium acetylacetonate, yttrium chloride, yttrium fluoride and yttrium nitrate.

In the disperse system, a molar concentration of the zinc compound, the indium compound, the gallium compound, the tin compound, the hafnium compound, the zirconium compound, the magnesium compound, the yttrium compound or the thallium compound may be about 0.1 mol/l (M) to about 10 mol/l (M).

Preparing the oxide material sol solution may further include adding a sol stabilizer to the disperse system. The sol stabilizer may include at least one selected from the group consisting of mono-ethanolamine, di-ethanolamine and tri-ethanolamine.

Preparing the oxide material sol solution may further include adding acid or base to the disperse system to adjust a potential of hydrogen (pH) of the disperse system. The acid may include acetic acid ($CH_3COOH$), and the base may include at least one selected from the group consisting of ammonium hydroxide ($NH_3OH$), potassium hydroxide (KOH) and sodium hydroxide (NaOH). The potential of hydrogen (pH) of the disperse system may be adjusted about 1 to 10.

The thin film pattern may have a size of about 3 mm to about 9 μm. A shape of the thin film may be determined by a shape of the sol pattern provided on the print roll, and the thin film may have one of various shapes, for example, a dot shape, a rectangular shape or the like.

In an exemplary embodiment, the composition used in formation of an oxide thin film includes a zinc compound, and at least one non-zinc compound selected from the group consisting of an indium compound, a gallium compound, a tin compound, a hafnium compound, a zirconium compound, a magnesium compound, an yttrium compound and a thallium compound. A mole ratio of the zinc compound versus the non-zinc compound is about 1:0.1 to about 1:2.

In an exemplary embodiment, the method of forming an oxide thin film includes coating a solution including at least two compounds selected from the group consisting of a zinc compound, an indium compound, a gallium compound, a tin compound, a hafnium compound, a zirconium compound, a magnesium compound, an yttrium compound and a thallium compound. A mole ratio of the zinc compound versus at least one of the indium compound, the gallium compound, the tin compound, the hafnium compound, the zirconium compound, the magnesium compound, the yttrium compound and the thallium compound is about 1:0.1 to about 1:2.

In an exemplary embodiment, the method of fabricating a liquid solution used in formation of an oxide thin film includes mixing at least two dispersoids selected from the group consisting of a zinc compound, an indium compound, a gallium compound, a tin compound, a hafnium compound, a zirconium compound, a magnesium compound, an yttrium compound and a thallium compound in a dispersion medium corresponding to the selected dispersoids to form a disperse system. A mole ratio of the zinc compound versus at least one of the indium compound, the gallium compound, the tin compound, the hafnium compound, the zirconium compound, the magnesium compound, the yttrium compound and the thallium compound is about 1:0.1 to about 1:2.

In an exemplary embodiment, the method of fabricating a thin film transistor includes preparing an oxide semiconductor based sol solution, supplying the prepared oxide semiconductor based sol solution onto a surface of a print roll to form a sol pattern, transferring the sol pattern from the surface of the print roll onto the substrate using a roll-to-roll process, and drying and heating the sol pattern transferred on the substrate to form a channel layer pattern on the substrate.

The method may further include applying a surface treatment process to a surface of the substrate to change the surface of the substrate into a hydrophilic surface or a hydrophobic surface before the sol pattern on the print roll is transferred onto the substrate. The sol pattern transferred on the substrate may be dried and heated at a temperature of about 300° C. to about 1000° C.

The method may further include sequentially forming a conductive layer acting as a gate and an insulation layer acting as a gate insulation layer on the substrate before the sol pattern on the print roll is transferred onto the substrate.

The method may further include transferring oxide conductor based sol patterns supplied on a print roll onto the substrate using a roll-to-roll process to form a source pattern and a drain pattern after the channel layer pattern is formed.

The method may further include transferring an oxide conductor based sol pattern supplied on a print roll onto the substrate using a roll-to-roll process to form a gate pattern, and transferring an oxide insulator based sol pattern supplied on a print roll onto the substrate using a roll-to-roll process to form a gate insulation pattern.

In an exemplary embodiment, the method of fabricating an oxide semiconductor device includes forming an electrode on a substrate, forming a copper layer on the substrate, preparing an oxide semiconductor based sol solution, supplying the oxide semiconductor based sol solution onto the substrate to form a semiconductor layer of a first conductivity type contacting the electrode on the substrate, and supplying acid onto the copper layer and applying a thermal treatment to the copper layer to form a copper oxide nano-structure of a second conductivity type that is grown from the copper layer to contact the electrode.

Prior to formation of the electrode, the method may further include forming a gate electrode layer on the substrate, and forming a gate insulation layer on the gate electrode layer. Forming the electrode may include forming first, second and third source/drain electrodes on the gate insulation layer. The first source/drain electrode may be formed between the second and third source/drain electrodes. Forming the semiconductor layer of the first conductivity type may include providing an oxide semiconductor based sol solution on the gate insulation layer between the first and second source/drain electrodes to form an oxide semiconductor layer of a first conductivity type contacting both the first and second source/drain electrodes. The copper layer may be formed on a top surface of the third source/drain electrode and the copper oxide nano-structure may be grown from the copper layer to contact the first source/drain electrode.

The thermal treatment applied to the copper layer may be performed at a temperature of about 300° C. to about 1000° C. The thermal treatment may be performed in vacuum. The thermal treatment may be performed using at least one of a nitrogen gas, a hydrogen gas and an oxygen gas as an ambient gas.

Preparing the oxide semiconductor based sol solution may include mixing at least one dispersoid selected from the group consisting of a zinc compound, an indium compound, a gallium compound, a tin compound, a hafnium compound, a zirconium compound, a magnesium compound, an yttrium compound and a thallium compound in a dispersion medium corresponding to the selected dispersoid to form a disperse system, stirring the disperse system, and aging the stirred disperse system.

The dispersoid may be formed by mixing the zinc compound and at least one non-zinc compound selected from the group consisting of the indium compound, the gallium compound, the tin compound, the hafnium compound, the zirconium compound, the magnesium compound, the yttrium compound and the thallium compound in a mole ratio of about 1:0.1 to about 1:2, respectively. The dispersion medium may include at least one selected from the group consisting of isopropanol, 2-methoxyethanol, dimethylformamide, ethanol, de-ionized water, methanol, acetylacetone, dimethylamineborane and acetonitrile.

In the disperse system, a molar concentration of the zinc compound, the indium compound, the gallium compound, the tin compound, the hafnium compound, the zirconium compound, the magnesium compound, the yttrium compound or the thallium compound may be about 0.1 mol/l (M) to about 10 mol/l (M).

Preparing the oxide material sol solution may further include adding acid or base to the disperse system to adjust a potential of hydrogen (pH) of the disperse system. The acid may include acetic acid ($CH_3COOH$), and the base may include at least one selected from the group consisting of ammonium hydroxide ($NH_3OH$), potassium hydroxide (KOH) and sodium hydroxide (NaOH). The potential of hydrogen (pH) of the disperse system may be adjusted within the range of about 1 to 10. In particular, the potential of hydrogen (pH) of the disperse system may be adjusted about 3.8 to 4.2.

In an exemplary embodiment, the oxide semiconductor device includes a gate electrode layer formed on a substrate, a gate insulation layer formed on the gate electrode layer, second and third source/drain electrodes formed on the gate insulation layer, a first source/drain electrode disposed between the second and third source/drain electrodes, a semiconductor layer of a first conductivity type formed on the gate insulation layer between the first and second source/drain electrodes to act as a channel region that connects the first source/drain electrode to the second source/drain electrode, a copper layer formed on the third source/drain electrode, and a copper oxide nano-structure of a second conductivity type grown from the copper layer to contact the first source/drain electrode.

The oxide semiconductor device may be a complementary metal-oxide-semiconductor (CMOS) device.

In an exemplary embodiment, the semiconductor device includes a copper oxide nano-structure of a first conductivity type, and an oxide semiconductor layer of a second conductivity type surrounding an outer circumference of the copper oxide nano-structure to form a PN junction together with the copper oxide nano-structure.

The oxide semiconductor device is a junction field effect transistor (JFET). In this case, the oxide semiconductor device may further include a pair of source/drain electrodes formed at both ends of the copper oxide nano-structure respectively, and a gate electrode formed on the oxide semiconductor layer opposite to the copper oxide nano-structure.

In an exemplary embodiment, the method of fabricating an oxide nano-structure using a sol-gel process and a porous nano-structure is provided. The method includes steps of (a) applying a surface treatment to a substrate having the porous nano-structure, (b) injecting an oxide compound sol material into the porous nano-structure, (c) drying and heating the oxide compound sol material using a thermal treatment to transform the oxide compound sol material in the porous nano-structure into an oxide nano-structure through a gelled pattern, and (d) separating the porous nano-structure from the oxide nano-structure.

The substrate having the porous nano-structure may be formed of an anodic aluminum oxide (AAO) material or an acrylamide (AAM) material.

In the step (b), the oxide compound sol material may be injected into the porous nano-structure using a spin coating process or a dip coating process.

In the step (b), the oxide compound sol material may be injected into the porous nano-structures at a temperature of about 80° C. to about 100° C. under a vacuum condition of about $1 \times 10^{-1}$ torr to about $1 \times 10^{-7}$ torr.

In the step (b), the oxide compound sol material may be formed by mixing at least two dispersoids selected from the group consisting of a zinc compound, an indium compound, a gallium compound, a tin compound, a hafnium compound, a zirconium compound, a magnesium compound, an yttrium compound and a thallium compound in a dispersion medium corresponding to the selected dispersoids to form a disperse system, stirring the disperse system, and aging the stirred disperse system. A mole ratio of the zinc compound versus at least one selected from the group consisting of the indium compound, the gallium compound, the tin compound and the thallium compound may be about 1:0.1 to about 1:2.

The dispersion medium may include at least one selected from the group consisting of isopropanol, 2-methoxyethanol, dimethylformamide, ethanol, de-ionized water, methanol, acetylacetone, dimethylamineborane and acetonitrile.

The zinc compound may include at least one selected from the group consisting of zinc citrate dihydrate, zinc acetate, zinc acetate dihydrate, zinc acetylacetonate hydrate, zinc acrylate, zinc chloride, zinc diethyldithiocarbamate, zinc dimethyldithiocarbamate, zinc fluoride, zinc fluoride hydrate, zinc hexafluoroacetylacetonate dihydrate, zinc methacrylate, zinc nitrate hexahydrate, zinc nitrate hydrate, zinc trifluoromethanesulfonate, zinc undecylenate, zinc trifluoroacetate hydrate, zinc tetrafluoroborate hydrate and zinc perchlorate hexahydrate.

The indium compound may include at least one selected from the group consisting of indium chloride, indium chloride tetrahydrate, indium fluoride, indium fluoride trihydrate, indium hydroxide, indium nitrate hydrate, indium acetate hydrate, indium acetylacetonate and indium acetate.

The gallium compound may include at least one selected from the group consisting of gallium acetylacetonate, gallium chloride, gallium fluoride and gallium nitrate hydrate.

The tin compound may include at least one selected from the group consisting of tin acetate, tin chloride, tin chloride dihydrate, tin chloride pentahydrate and tin fluoride.

The thallium compound may include at least one selected from the group consisting of thallium acetate, thallium acetylacetonate, thallium chloride, thallium chloride tetrahydrate, thallium cyclopentadienide, thallium fluoride, thallium formate, thallium hexafluoroacetylacetonate, thallium nitrate, thallium nitrate trihydrate, thallium trifluroacetate and thallium perchlorate hydrate.

A molar concentration of the zinc compound, the indium compound, the gallium compound, the tin compound or the thallium compound in the disperse system may be about 0.1 mol/l (M) to about 10 mol/l (M).

Preparing the oxide material sol solution may further include adding a sol stabilizer to the disperse system. The sol stabilizer may have the same moles as the zinc compound in the disperse system.

The sol stabilizer may include at least one selected from the group consisting of mono-ethanolamine, di-ethanolamine and tri-ethanolamine.

Preparing the oxide material sol solution may further include adding acid or base to the disperse system to adjust a potential of hydrogen (pH) of the disperse system.

The potential of hydrogen (pH) of the disperse system may be lowered if acetic acid ($CH_3COOH$) is added to the disperse system. Alternatively, the potential of hydrogen (pH) of the disperse system may be heightened if a base (e.g., ammonium hydroxide, potassium hydroxide or sodium hydroxide) is added to the disperse system. Thus, the potential of hydrogen (pH) of the disperse system may be appropriately adjusted within the range of about 1 to 10 by adding the acid or the base to the disperse system.

The potential of hydrogen (pH) of the disperse system may be adjusted within the range of about 3.8 to 4.2.

In the step (c), the thermal treatment may be performed at a temperature of about 300° C. to about 1000° C.

In the step (d), separating the porous nano-structure from the oxide nano-structure may include etching the porous nano-structures using a sodium hydroxide solution and obtaining the oxide nano-structure using a centrifugal separation process.

In the step (d), a shape of the oxide nano-structure may be determined by a shape of the porous nano-structure. The oxide nano-structure may be formed to have a dot shape or a cylindrical shape. The oxide nano-structure may be formed to have a size of about several nanometers to about several micrometers.

Effect of Invention

According to the methods of forming an electronic device such as a thin film transistor using sol-gel processes and roll-to-roll processes according to the exemplary embodiments, the electronic device such as the thin film transistor including a desired material of a multi-component system may be easily formed by selecting an appropriate sol solution and changing composition of the sol solution. Further, according to the exemplary embodiments, thin film patterns may be easily formed on a substrate having a large area with high throughput and low cost. In addition, since the fabrication methods according to the exemplary embodiments utilize roll-to-roll processes with print rolls, a high process throughput may be provided and mass production may be available. Moreover, various and diverse electronic devices other than the thin film transistors may also be formed with high throughput by changing an order of the roll-to-roll processes and/or shapes and sizes of patterns. Furthermore, the exemplary embodiments may suppress a coffee ring effect to enhance the thickness uniformity of the thin film patterns.

According to the methods of forming an electronic device such as a thin film transistor using sol-gel processes and roll-to-roll processes according to the exemplary embodiments, self-aligned copper oxide nano-structures may be obtained through the sol-gel processes and subsequent thermal treatment processes. Thus, the nano-structures may be disposed at desired locations of the electronic device even without use of complicated processes such as separation, refinement and arrangement. That is, even photolithography processes may not be required. Further, according to the exemplary embodiments, catalyst components may not remain at ends of the nano-structures. Thus, single crystalline pure nano-structures can be obtained. Moreover, oxide semiconductor materials of a multi-component system can be more efficiently formed as compared with the conventional art, and diverse oxide semiconductor materials can be formed by changing and/or adjusting the properties of the sol material. Furthermore, it may be easy to change a phase of the thin film, a size of the nano-structures or electrical characteristics of the nano-structures by varying temperature of a thermal treatment and/or process time of the thermal treatment.

According to the methods of forming an electronic device such as a thin film transistor using sol-gel processes and roll-to-roll processes according to the exemplary embodiments, oxide nano-structures can be obtained by injecting an oxide material into porous nano-structures using a sol-gel process as a basic process. Thus, a metal oxide material of a multi-component system can be more effectively formed as compared with the conventional art, and the oxide nano-structures can be formed to have a desired phase, a desired composition and/or a desired size.

Further, unlike the fabrication methods of nano-structures using conventional deposition processes, the oxide material can be easily injected into the porous nano-structures using a sol-gel process. Thus, the exemplary embodiments can provide the possibility of mass production. In addition, the size of the nano-structure can be easily controlled by adjusting the size of the porous nano-structure in which an oxide material solution (e.g., liquid oxide compound sol) is injected, and it may also be easy to change a type and a composition of the sol solution. Moreover, a phase of the oxide material can be easily changed by changing process conditions of thermal treatment.

In addition, self-aligned oxide nano-structures can be formed using a well-aligned porous anodic aluminum oxide (AAO) solution and an In—Ga—ZnO (IGZO) solution. Thus, the exemplary embodiments may provide the possibility of mass production. Further, unlike the conventional deposition process utilizing the vacuum apparatus and high temperature process, the exemplary embodiments may not require gas, powder and catalyst. Thus, low cost devices can be provided.

BEST MODE FOR CARRYING OUT THE INVENTION

Figure 1:
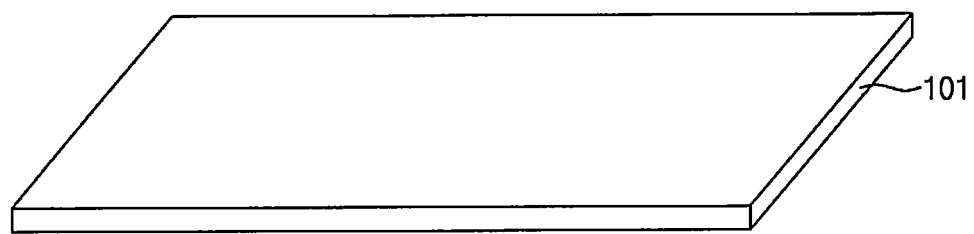
FIG. 1 is a perspective view illustrating a substrate prior to a roll-to-roll process according to an exemplary embodiment.

Exemplary embodiments of the inventive concept will be described more fully hereinafter with reference to the accompanying drawings. The exemplary embodiments may, however, be embodied in many different forms and should not be construed as limited to the embodiments set forth herein. In the drawings, the sizes and the shapes of elements (e.g., layers and regions) are exaggerated for clarity.

<Electronic Devices and Methods of Fabricating the Same Using a Sol-Gel Process and a Roll-to-Roll Process>

Fabrication of semiconductor devices and display devices may correspond to typical devices industry. The semiconductor devices and the display devices may be manufactured in a vacuum chamber having a relatively large size using semiconductor fabrication processes. For example, thin film transistors may be formed using a chemical vapor deposition (CVD) process, a pulsed laser deposition (PLD) process and/or a sputtering process that utilizes a vacuum apparatus including a vacuum chamber. Vacuum processes using the vacuum chamber may provide advantages that produce high quality thin films since the thin films are formed in vacuum. However, the vacuum process may have a disadvantage of long deposition time. This is because it takes long time to evacuate the vacuum chamber. Further, the vacuum process may need a high priced apparatus and may need a photolithography process for forming patterns having desired shapes.

Unlike the deposition process utilizing the conventional vacuum process, the deposition process utilizing a sol-gel process may need a low priced apparatus and may provide a large area of deposition. Thus, the sol-gel process may have an advantage of a high throughput. As a result, the sol-gel process may be suitable for mass production. For the reasons describe above, methods of fabricating an electronic device using the sol-gel process have been proposed. For example, a sol solution may be coated on a substrate using a spin coating method, a dip coating method, an ink-jet coating method or a nano imprint method in order to fabricate electronic devices.

In general, materials used in fabrication of the electronic devices with the sol-gel process may include an organic semiconductor material such as pentacene and an inorganic semiconductor material such as a zinc oxide (ZnO) material. The organic semiconductor material may be more readily damaged by oxygen and water. Thus, the organic semiconductor materials have been faced with some technical limitations in improving the characteristics of organic semiconductor based thin film transistors formed using the sol-gel process as compared with amorphous silicon thin film transistors (a-Si TFTs). Meanwhile, oxide semiconductor based TFTs may exhibit excellent electrical characteristics including carrier mobility as compared with the a-Si TFTs. The oxide material based thin films may have excellent electrical characteristics as compared with the organic material based thin films. Further, the oxide material based thin films may stably maintain their characteristics even though they are exposed to oxygen or water.

The spin coating method is one of the most popular deposition techniques used in fabrication of the electronic devices using the sol-gel process. The spin coating method may include loading a substrate on a chuck of a spin coater, supplying a sol solution onto the substrate, and rotating the substrate with the chuck to form a uniform and thin film coated on the substrate. When the sol solution is an oxide material sol solution, the thin film coated on the substrate may be used as an active channel layer of the thin film transistors (TFTs). The spin coating method may produce a desired composition material with the sol-gel process and may reduce the process time for fabricating the TFTs as compared with the pulsed laser deposition (PLD) process and the sputtering process. However, according to the spin coating method, the thin film may be coated on an entire surface of the substrate like the thin film formed using the vacuum process. Thus, in the event that the spin coating method is used in formation of the thin film, an additional process for patterning the thin film may be required to form material patterns having desired shapes.

Another method of forming a thin film using the sol-gel process may be a dip coating method that includes dipping a substrate into a sol solution. The dip coating method may produce a desired thin film on the substrate within a relatively shorter process time as compared with the spin coating method. However, the thin film formed using the dip coating method may have a less uniform thickness than the thin film formed using the spin coating method. Thus, the dip coating method may not be suitable for fabrication of the TFTs or the electronic devices that require a uniform thin film.

Yet another method of forming a thin film with the sol-gel process may be an ink-jet coating method. According to the ink-jet coating method, a thin film transistor (TFT) may be formed by injecting an oxide material sol solution into an ink-jet apparatus, supplying the oxide material sol solution onto predetermined regions (active channel regions) of a substrate, and curing the oxide material sol solution on the substrate. This ink-jet coating method may have an advantage that the sol solution can be selectively supplied onto the predetermined regions of the substrate. However, according to the ink-jet coating method, a thin film formed on the substrate may have a non uniform thickness due to a coffee ring effect. Further, the ink-jet coating method may cause a poor adhesion between the thin film and an underlying layer (or overlying layer). The coffee ring effect means that the thin film has a non uniform thickness after the curing step. That is, the thickness of the thin film on a central region may be different from the thickness of the thin film on an edge region.

Still yet another method of forming a thin film with the sol-gel process may be a nano imprint method. The nano imprint method may produce small and fine thin film patterns having a space or a width which is less than a resolution limit of the photolithography process. The nano imprint method may include various methods. For example, the nano imprint method may be performed by coating a sol-gel material on a substrate and patterning the sol-gel material using a nano imprint technique. Alternatively, the nano imprint method may be performed by bringing a stamp into contact with a substrate and forming desired patterns using a dip coating method. Alternatively, the nano imprint method may be performed by coating a stamp with a sol solution and pressing the stamp onto a substrate. However, the nano imprint method may cause damage and contamination of substrate. Further, when the stamp has a large area, it may be difficult to press the stamp with uniform pressure. That is, it may be difficult to uniformly form all the thin film patterns on the substrate having a large area.

Accordingly, the exemplary embodiments may provide methods of fabricating an electronic device such as a thin film transistor, which are capable of reducing process time and producing uniform thin film patterns even without use a photolithography process.

Further, the exemplary embodiments may provide methods of fabricating an electronic device using a sol-gel process which is capable of obtaining a thin film having a desired composition.

Exemplary embodiments of the inventive concept will be described more fully hereinafter with reference to the accompanying drawings. The exemplary embodiments may, however, be embodied in many different forms and should not be construed as limited to the embodiments set forth herein. In the drawings, the sizes and the shapes of elements (e.g., layers and regions) are exaggerated for clarity. Like designators in the drawings and description refer to like elements throughout this description.

FIG. 1 is a perspective view illustrating a substrate prior to a roll-to-roll process according to an exemplary embodiment. Referring to FIG. 1, a surface of a substrate 101, particularly, predetermined surface regions of the substrate 101 may be exposed to a surface treatment process, thereby changing into hydrophilic surfaces or hydrophobic surfaces. For example, the surface treatment process for obtaining the hydrophilic surfaces may be performed using sodium hydroxide (NaOH) with oxygen plasma, piranha solution, or mixture of de-ionized water and acetone, and the surface treatment process for obtaining the hydrophobic surfaces may be performed using polydimethylsiloxane (PDMS), toluene, or octadecyltetrachlorosilane-self-assembled-monolayers (OTS-SAMs). The surface treatment process may improve a thickness uniformity of a thin film when a print roll is stamped on a substrate using a subsequent roll-to-roll process to transfer sol patterns from the print roll onto the substrate. The surface treatment process may be applied to an entire surface of the substrate or the predetermined surface regions (e.g., device regions) of the substrate.

Figure 2:
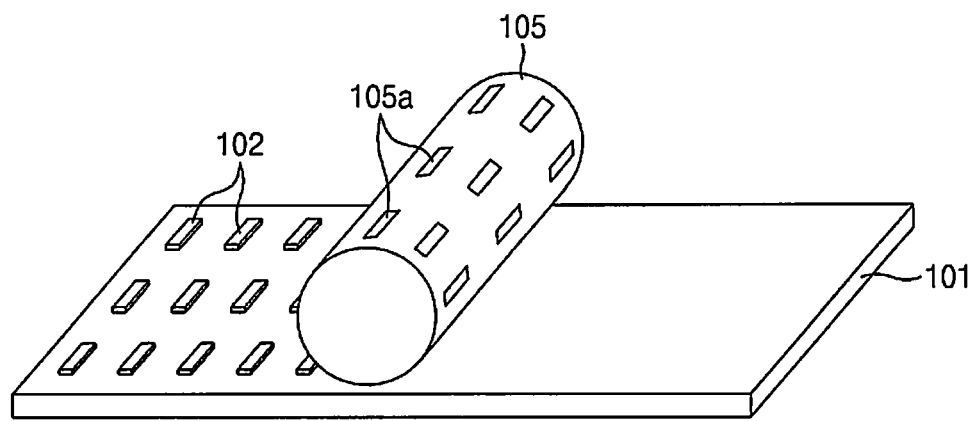
FIG. 2 is a perspective view illustrating a method of printing and transferring sol solution patterns from a print roll surface onto a substrate using a roll-to-roll process according to an exemplary embodiment.
Figure 3:
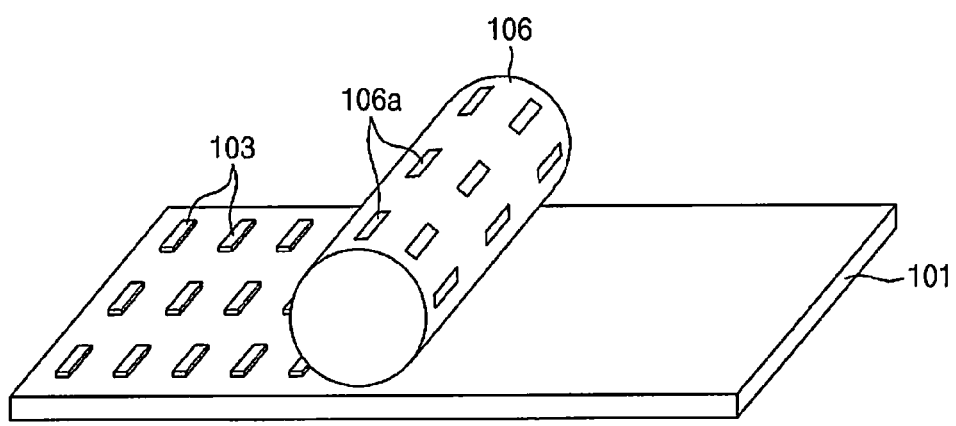
FIG. 3 is a perspective view illustrating a method of printing and transferring sol solution patterns from a print roll surface onto a substrate using a roll-to-roll process according to another exemplary embodiment.
Figure 4:
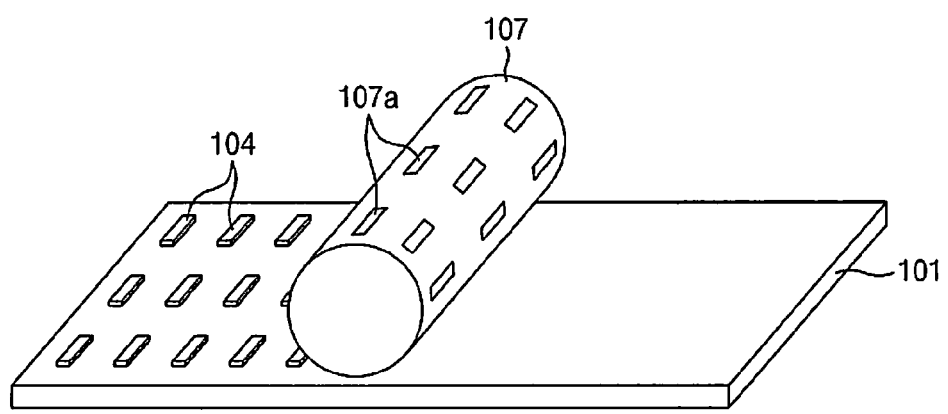
FIG. 4 is a perspective view illustrating a method of printing and transferring sol solution patterns from a print roll surface onto a substrate using a roll-to-roll process according to yet another exemplary embodiment.

FIGS. 2 to 4 are schematic perspective views illustrating processes for forming thin film patterns having a property of semiconductors, insulators or conductors according to a characteristic of oxide sol using a sol-gel process and a roll-to-roll process. Referring to FIGS. 2 to 4, a sol solution having a property of an oxide semiconductor, an oxide conductor, or an oxide insulator may be prepared before thin film patterns for electronic devices are printed on the substrate 101 by a roll-to-roll process utilizing a print roll 105, 106 or 107.

Forming the sol solution used in the roll-to-roll process may include mixing compound dispersoid having a property of a desired material (e.g., a semiconductor, a conductor or an insulator) in a dispersion medium corresponding to the selected dispersoid to form a disperse system, stirring the disperse system, and aging the stirred disperse system. The compound dispersoid may include at least one selected from the group consisting of a zinc compound, an indium compound, a gallium compound, a tin compound, a hafnium compound, a zirconium compound, a magnesium compound, an yttrium compound and a thallium compound. In particular, the dispersoid of the sol solution may include a zinc compound. For example, the dispersoid of the sol solution may be formed by mixing the zinc compound and a non-zinc compound (e.g., at least one of indium compound, gallium compound, tin compound, hafnium compound, zirconium compound, magnesium compound, yttrium compound and thallium compound) in a mole ratio of about 1:0.1 to about 1:2. Further, a molar concentration of the zinc compound, the indium compound, the gallium compound, the tin compound, the hafnium compound, the zirconium compound, the magnesium compound, the yttrium compound or the thallium compound in the disperse system may be about 0.1 mol/l (M) to about 10 mol/l (M).

The dispersion medium of the sol solution may include at least one selected from the group consisting of isopropanol, 2-methoxyethanol, dimethylformamide, ethanol, de-ionized water, methanol, acetylacetone, dimethylamineborane and acetonitrile.

Specifically, the zinc compound used as the dispersoid of the sol solution may include at least one selected from the group consisting of zinc citrate dihydrate, zinc acetate, zinc acetate dihydrate, zinc acetylacetonate hydrate, zinc acrylate, zinc chloride, zinc diethyldithiocarbamate, zinc dimethyldithiocarbamate, zinc fluoride, zinc fluoride hydrate, zinc hexafluoroacetylacetonate dihydrate, zinc methacrylate, zinc nitrate hexahydrate, zinc nitrate hydrate, zinc trifluoromethanesulfonate, zinc undecylenate, zinc trifluoroacetate hydrate, zinc tetrafluoroborate hydrate and zinc perchlorate hexahydrate.

Further, the indium compound used as the dispersoid of the sol solution may include at least one selected from the group consisting of indium chloride, indium chloride tetrahydrate, indium fluoride, indium fluoride trihydrate, indium hydroxide, indium nitrate hydrate, indium acetate hydrate, indium acetylacetonate and indium acetate.

The gallium compound used as the dispersoid of the sol solution may include at least one selected from the group consisting of gallium acetylacetonate, gallium chloride, gallium fluoride and gallium nitrate hydrate.

The tin compound used as the dispersoid of the sol solution may include at least one selected from the group consisting of tin acetate, tin chloride, tin chloride dihydrate, tin chloride pentahydrate and tin fluoride.

The thallium compound used as the dispersoid of the sol solution may include at least one selected from the group consisting of thallium acetate, thallium acetylacetonate, thallium chloride, thallium chloride tetrahydrate, thallium cyclopentadienide, thallium fluoride, thallium formate, thallium hexafluoroacetylacetonate, thallium nitrate, thallium nitrate trihydrate, thallium trifluroacetate and thallium perchlorate hydrate.

The hafnium compound used as the dispersoid of the sol solution may include at least one selected from the group consisting of hafnium chloride and hafnium fluoride.

The magnesium compound used as the dispersoid of the sol solution may include at least one selected from the group consisting of magnesium acetate, magnesium chloride, magnesium nitrate hydrate and magnesium sulfate.

The zirconium compound used as the dispersoid of the sol solution may include at least one selected from the group consisting of zirconium acetate, zirconium acetylacetonate, zirconium chloride and zirconium fluoride.

The yttrium compound used as the dispersoid of the sol solution may include at least one selected from the group consisting of yttrium acetate, yttrium acetylacetonate, yttrium chloride, yttrium fluoride and yttrium nitrate.

When the sol solution is formed, a sol stabilizer may be added to the disperse system. The sol stabilizer may include mono-ethanolamine, di-ethanolamine or tri-ethanolamine. The sol stabilizer may have the same moles as the compound material of the dispersoid in the disperse system.

Moreover, when the sol solution is formed, acid or base may be added to the disperse system to adjust a potential of hydrogen (pH) of the disperse system. For example, the potential of hydrogen (pH) of the disperse system may be lowered if acetic acid ($CH_3COOH$) is added to the disperse system, and the potential of hydrogen (pH) of the disperse system may be heightened if a base (e.g., ammonium hydroxide, potassium hydroxide or sodium hydroxide) is added to the disperse system. Thus, the potential of hydrogen (pH) of the disperse system may be appropriately adjusted within the range of about 1 to 10 by adding the acid (e.g., acetic acid) or the base to the disperse system.

The oxide semiconductor based sol solution (e.g., zinc oxide based sol solution) prepared by the above methods may be provided on a surface of the print roll 105, 106 or 107 in a pattern form. Referring to FIG. 2, the sol solution may be provided on the surface of the cylindrical print roll 105 in a plurality of patterns 105a. For example, the sol solution may be selectively coated on block patterns (for stamping) formed on the surface of the print roll 105, thereby providing the plurality of sol patterns 105a on the print roll 105. The print roll 105 having the sol patterns 105a may be then rolled and stamped on the substrate 101, thereby transferring the sol patterns 105a onto the substrate 101. As a result, oxide semiconductor based sol patterns 102 may be formed on the substrate 101.

After forming the oxide semiconductor based sol patterns 102 on the substrate 101, the sol patterns 102 may be dried and heated using a thermal treatment process to transform the sol patterns 102 into gelled patterns. As a result, oxide semiconductor thin film patterns may be formed on the substrate 101, and the oxide semiconductor thin film patterns may be used as active channel layers of desired electronic devices (e.g., thin film transistors or diodes). The thermal treatment process for forming the gelled patterns or the thin film patterns may be performed at a temperature of about 300° C. to about 1000° C.

According to the above exemplary embodiment, thin film patterns may be easily obtained even on a substrate having a large area through a stamping print technique that is employed in a sol-gel process and a roll-to-roll process. That is, the present embodiment may improve throughput of the thin film patterns having a uniform thickness even without use of a vacuum apparatus. That is, the present embodiment may resolve the disadvantages of the ink-jet printing method even without use of a vacuum process. Further, the plurality of thin film patterns may be printed on the substrate 101 by rolling the print roll 105. Thus, the substrate 101 may be less damaged and more uniformly pressurized as compared with the conventional nano imprint method.

The methods proposed by the inventor(s) may be applied to not only formation of the oxide semiconductor thin film patterns described with reference to FIG. 2 but also formation of oxide insulator thin film patterns or oxide conductor thin film patterns by changing composition of the sol solution.

Referring to FIG. 3, an oxide insulator based sol solution (e.g., a hafnium compound material based sol solution, a zirconium compound material based sol solution, or a dispersoid based sol solution containing a large quantity of hafnium compound and/or zirconium compound) may be provided on the surface of the cylindrical print roll 106, thereby forming sol patterns 106a on the cylindrical print roll 106, and the sol patterns 106a on the cylindrical print roll 106 may be transferred on the substrate 101 by rolling the cylindrical print roll 106, thereby forming sol patterns 103 on the substrate 101. The sol patterns 103 may be dried and heated using the same manners as the thermal treatment process described with reference to FIG. 2 to form oxide insulator thin film patterns on the substrate 101. The oxide insulator thin film patterns may be used as components of desired electronic devices, for example, thin film transistors or diodes.

FIG. 4 is a perspective view illustrating a method of forming oxide conductor thin film patterns on a substrate using the sol-gel process and the roll-to-roll process described above. Referring to FIG. 4, an oxide conductor based sol solution may be provided on the surface of the cylindrical print roll 107, thereby forming sol patterns 107a on the cylindrical print roll 107, and the sol patterns 107a on the cylindrical print roll 107 may be transferred on the substrate 101 by rolling the cylindrical print roll 107, thereby forming sol patterns 104 on the substrate 101. The sol patterns 104 may be dried and heated using the same manners as the thermal treatment process described with reference to FIG. 2 to form oxide conductor thin film patterns on the substrate 101. The oxide conductor thin film patterns may be used as components of desired electronic devices, for example, thin film transistors or diodes.

The processes described with reference to FIGS. 2, 3 and 4 may be combined with each other to form a desired electronic device. For example, the desired electronic device may be formed by appropriately adjusting an order of the processes illustrated in FIGS. 2 to 4 and by changing the shape of the patterns. The shapes of the patterns formed on the substrate 101 may depend on the shapes of the sol patterns provided on the surface of the print roll 105, 106 or 107 and may have diverse and various forms, for example, dot shapes, rectangular shapes or the like. The sizes of the thin film patterns may be within the range of several nanometers (mm) to several micrometers (μm), particularly, of about 3 mm to about 9 μm.

Figure 5:
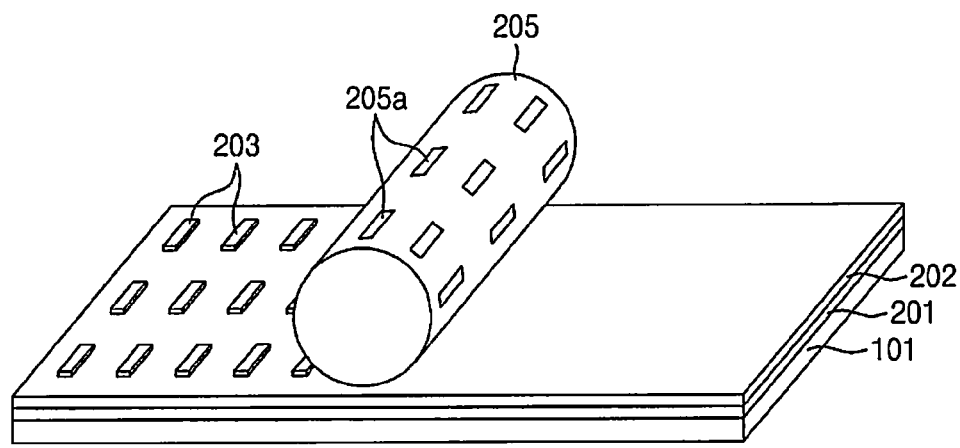
FIGS. 5 and 6 are perspective views illustrating methods of fabricating a thin film transistor using roll-to-roll processes according to some exemplary embodiments.
Figure 6:
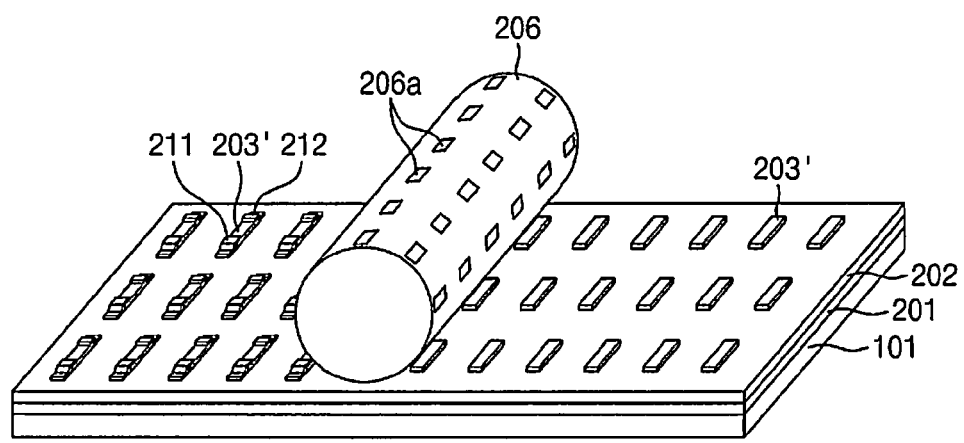

FIGS. 5 and 6 are perspective views illustrating methods of fabricating a thin film transistor (TFT) using a sol-gel process and a roll-to-roll process according to some exemplary embodiments. In the present exemplary embodiment, the roll-to-roll process may be applied to formation of semiconductor channel layers and source/drain layers of the TFT.

As illustrated in FIG. 5, conductive layer 201 and an insulation layer 202 may be sequentially formed on a substrate 101. The conductive layer 201 may act as a gate and the insulation layer 202 may act as a gate insulation layer. Subsequently, a sodium hydroxide plasma treatment or an oxygen plasma treatment may be applied to the insulation layer 202 to provide a preparation for a subsequent roll-to-roll process (a hydrophilic surface treatment or a hydrophobic surface treatment). Using the same manners as described with reference to FIG. 2, an oxide semiconductor based sol solution may be then provided on a surface of the print roll 205 to form sol patterns 205a on the print roll 205. A roll-to-roll process may be performed using the print roll 205 having the sol patterns 205a, thereby forming sol patterns 203 transferred on the insulation layer 202 which is formed on the substrate 101. The sol patterns 203 may be dried and heated using the same manners as the thermal treatment process described with reference to FIG. 2. As a result, oxide semiconductor channel layer patterns 203' may be formed on the insulation layer 202, as illustrated in FIG. 6.

Figure 7:
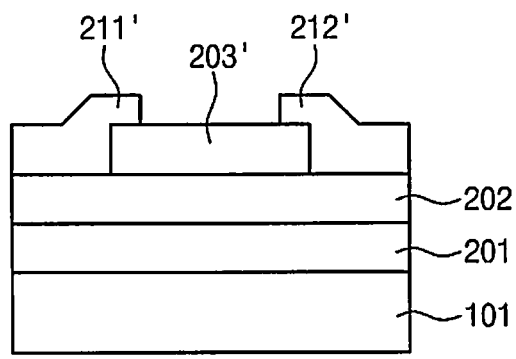
FIG. 7 is a cross sectional view illustrating a thin film transistor fabricated according to an exemplary embodiment.

Subsequently, an oxide conductor based sol solution may be provide on a surface of another pint roll 206 to form sol patterns 206a on the print roll 206. Another roll-to-roll process may be performed using the print roll 206 having the sol patterns 206a, thereby forming source/drain patterns 211 and 212 on the oxide semiconductor channel layer patterns 203'. The source/drain patterns 211 and 212 may also be dried and heated using the same manners as the thermal treatment process described with reference to FIG. 2. Thus, a pair of source/drain patterns 211' and 212' may be formed on both ends of each of the channel layer patterns 203', as illustrated in FIG. 7. As a result, a plurality of thin film transistors illustrated in FIG. 7 may be easily formed in large quantities.

In the above exemplary embodiments, the sol-gel process and the roll-to-roll process may be used only in formation of the semiconductor channel layers and the source/drain patterns. However, the sol-gel process and the roll-to-roll process may be used even in formation of other components than the semiconductor channel layers and the source/drain patterns. For example, the sol-gel process and the roll-to-roll process may also be used in formation of gates patterns (e.g., gate electrodes) and gate insulation layers constituting the thin film transistors. That is, the gate patterns may be formed by transferring oxide conductor based sol patterns provided on a surface of a print roll onto a substrate with the above described roll-to-roll process (refer to FIG. 4), and the gate insulation layers may be formed by transferring oxide insulator based sol patterns provided on a surface of a print roll onto a substrate with the above described roll-to-roll process (refer to FIG. 3). After the roll-to-roll process is performed, a thermal treatment process for transforming the sol patterns into gelled patterns may be required to form the thin film patterns.

Figure 8:
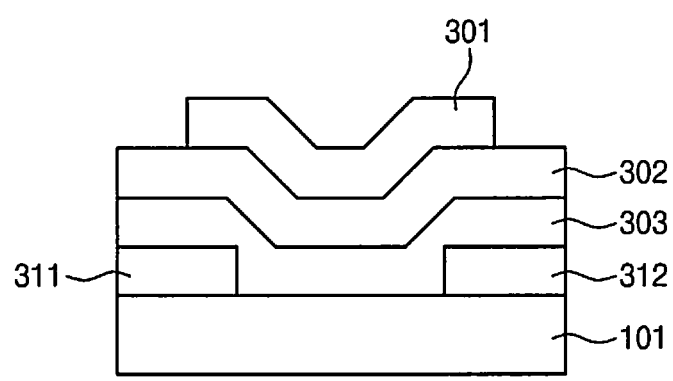
FIG. 8 is a cross sectional view illustrating a thin film transistor fabricated according to another exemplary embodiment.

According to the above exemplary embodiment, inverted staggered type of thin film transistors having a common bottom gate 201 may be formed. That is, the gate 201 may be formed to be adjacent to the substrate 101, and the source/drain patterns 211' and 212' may be formed on the channel layer opposite to gate 201. However, the inventive concept is not limited to the above exemplary embodiment s. That is, staggered type of thin film transistors having top gates 301 disposed on the channel layers opposite to the substrate may also be formed by appropriately changing an order of the roll-to-roll processes and sizes of the patterns, as illustrated in FIG. 8. In this case, source/drain patterns 311 and 312 may be formed on a substrate 101 using a sol-gel process and a roll-to-roll process, and channel layers 303, gate insulation layers 302 and gates 301 may be sequentially formed on the substrate including the source/drain patterns 311 and 312.

The inventive concept is not limited to the above exemplary embodiments and the accompanying drawings. The scope of the inventive concept is to be determined by the following claims, and it will be apparent to those skilled in the art that various changes and modifications may be made without departing from the spirit and scope of the inventive concept.

<Oxide Semiconductors and Methods of Fabricating the Same Using a Sol-Gel Process and Nano-Structures>

Nano-devices may be formed by applying nano-structures fabricated using various manners to electronic devices such as semiconductor devices. Recently, a study on the nano-devices has been increasingly demanded because the nano-devices have advantages of fast operation speed with large data.

In general, the nano-structures may be fabricated using a vapor-liquid-solid (VLS) mechanism, a solution-liquid-solid (SLS) mechanism, or other mechanisms by chemical reactions or thermal treatments. A metal catalyst may be required to fabricate the nano-structure using the VLS mechanism, and the metal catalyst may include metal (e.g., gold (Au), nickel (Ni) or iron (Fe)), which is capable of lowering a melting point of a material. When the VLS mechanism is used in fabrication of the nano-structures, the location and the diameter of the nano-structures may be controlled by the location and size of the catalysts. For example, in the event that a chemical vapor deposition (CVD) process is used to form the nano-structures, gaseous reactants may be combined with gold (on gold nano-cloud surfaces) acting as catalysts to generate nuclei and the nuclei may grow to form silicon nano-structures having a multi shell.

In order to fabricate nan-structures using an SLS mechanism, a liquid precursor and a catalyst such as gold may be required. The gold acting as the catalyst may increase overall yield of the nano-structures or may control the diameter and the location of the nano-structures. For example, when silicon nano-wires are fabricated, gold nano-particles, $(C_6H_5)_2SiH_2$ and hexane may be used as a metal catalyst, a silicon liquid precursor and a solvent, respectively. In this case, the $(C_6H_5)_2SiH_2$ may be decomposed into silicon atoms and the silicon atoms may be alloyed with the gold nano-particles to extract silicon. As a result, silicon nano-structures may be formed. The metal catalyst may control the diameter of the nano-structures and may control the location of the nano-structures. The nano-structures fabricated using the SLS mechanism may be grown at a relatively low temperature as compared with the nano-structures fabricated using the VLS mechanism. However, the crystallinity of the nano-structures fabricated using the SLS mechanism may be degraded as compared with the crystallinity of the nano-structures fabricated using the VLS mechanism.

The methods of fabricating the nano-structures using the aforementioned VLS mechanism use a deposition process that requires a high priced vacuum apparatus and a catalyst. Thus, the fabrication process may be complicated and the fabrication cost may be increased. Further, in the event that the nano-structures are fabricated using the SLS mechanism, the crystallinity of the nano-structures may be degraded and the fabrication process may be complicated. Moreover, it may be difficult to directly apply the nano-structures obtained using the VLS mechanism or the SLS mechanism to the semiconductor devices. That is, complicated processes, for example, separation, refinement and arrangement may be required after growth of the nano-structures in order to apply the nano-structures obtained using the VLS mechanism or the SLS mechanism to the semiconductor devices. In addition, catalyst components may remain at ends of the fabricated nano-structures, for example, nano-wires. Thus, it may be difficult to obtain single crystalline pure nano-structures without contamination.

Accordingly, the exemplary embodiments may provide methods of fabricating oxide semiconductor device having nano-structures with less contamination using a simplified and low cost fabrication process and a sol-gel process.

FIGS. 9 to 12 are perspective views illustrating a method of fabricating an oxide semiconductor device according to an exemplary embodiment. The present exemplary embodiment will be described in conjunction with a fabrication process of a complementary metal-oxide-semiconductor (CMOS) device such as a CMOS transistor. However, the inventive concept is not limited to the fabrication process of the CMOS device. For example, the inventive concept may be applied to fabrication processes of metal-oxide-semiconductor field effect transistors (MOSFETs), junction field effect transistors (JFETs), PN diodes or the like.

Figure 9:
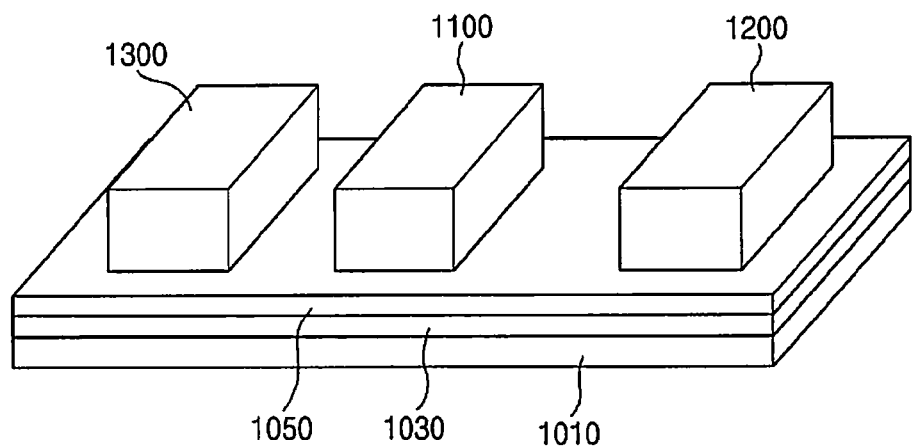
FIGS. 9 to 12 are perspective views illustrating a method of fabricating an oxide semiconductor device according to an exemplary embodiment.

Referring to FIG. 9, a gate electrode 1030 and a gate insulation layer 1050 may be formed on a substrate 1010 (e.g., a plastic based flexible substrate, a glass substrate or a silicon substrate). The gate electrode 1030 may be formed of a metal layer, and the gate insulation layer 1050 may be formed of a silicon oxide layer. A first source/drain electrode 1100, a second source/drain electrode 1200 and a third source/drain electrode 1300 may be formed on the gate insulation layer 1050. The first source/drain electrode 1100 may be formed between the second and third source/drain electrodes 1200 and 1300. As used herein the term "source/drain electrode" is intended to indicate any one of a source electrode and a drain electrode. These source/drain electrodes 1100, 1200 and 1300 may be formed of a metal material. The gate insulation layer 1050 may be formed by depositing an insulation material using a sputtering process or a plasma enhanced chemical vapor deposition (PECVD) process.

Figure 10:
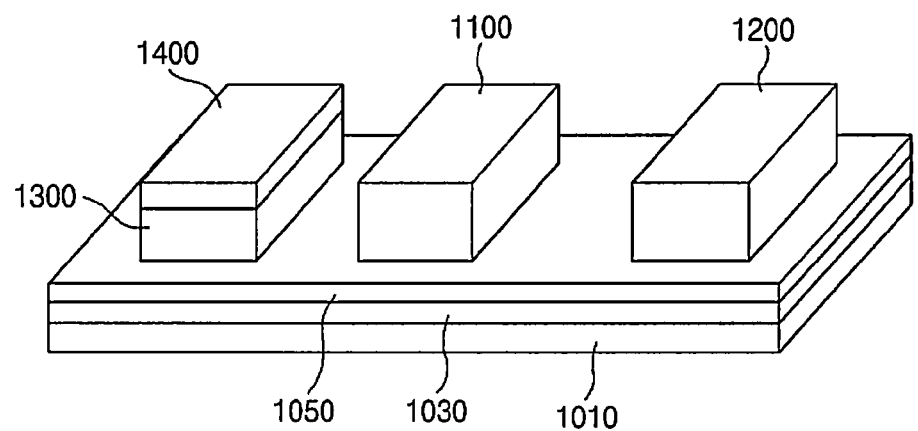

Referring to FIG. 10, a copper layer 1400 may be formed on the third source/drain electrode 1300. This copper layer 1400 may act as a seed layer for growing copper nano-structures (particularly, nano-wires), as described later.

Meanwhile, an oxide semiconductor based sol solution may be prepared in order to form an oxide semiconductor layer (1500 of FIG. 11) using a sol-gel process. The oxide semiconductor based sol solution used in the sol-gel process may be obtained by mixing compound dispersoid corresponding to a source material of the oxide semiconductor in a dispersion medium to form a disperse system, stirring the disperse system, and aging the stirred disperse system.

The compound dispersoid may include at least one selected from the group consisting of a zinc compound, an indium compound, a gallium compound, a tin compound, a hafnium compound, a zirconium compound, a magnesium compound, an yttrium compound and a thallium compound. In particular, the dispersoid of the sol solution may include the zinc compound and a non-zinc compound. In this case, the dispersoid of the sol solution may be formed by mixing the zinc compound and the non-zinc compound (e.g., at least one of an indium compound, a gallium compound, a tin compound, a hafnium compound, a zirconium compound, a magnesium compound, an yttrium compound and a thallium compound) in a mole ratio of about 1:0.1 to about 1:2. Further, a molar concentration of the zinc compound, the indium compound, the gallium compound, the tin compound, the hafnium compound, the zirconium compound, the magnesium compound, the yttrium compound or the thallium compound in the disperse system may be about 0.1 mol/l (M) to about 10 mol/l (M).

The dispersion medium of the sol solution may include at least one selected from the group consisting of isopropanol, 2-methoxyethanol, dimethylformamide, ethanol, de-ionized water, methanol, acetylacetone, dimethylamineborane and acetonitrile.

Specifically, the zinc compound used as the dispersoid of the sol solution may include at least one selected from the group consisting of zinc citrate dihydrate, zinc acetate, zinc acetate dihydrate, zinc acetylacetonate hydrate, zinc acrylate, zinc chloride, zinc diethyldithiocarbamate, zinc dimethyldithiocarbamate, zinc fluoride, zinc fluoride hydrate, zinc hexafluoroacetylacetonate dihydrate, zinc methacrylate, zinc nitrate hexahydrate, zinc nitrate hydrate, zinc trifluoromethanesulfonate, zinc undecylenate, zinc trifluoroacetate hydrate, zinc tetrafluoroborate hydrate and zinc perchlorate hexahydrate.

Further, the indium compound used as the dispersoid of the sol solution may include at least one selected from the group consisting of indium chloride, indium chloride tetrahydrate, indium fluoride, indium fluoride trihydrate, indium hydroxide, indium nitrate hydrate, indium acetate hydrate, indium acetylacetonate and indium acetate.

The gallium compound used as the dispersoid of the sol solution may include at least one selected from the group consisting of gallium acetylacetonate, gallium chloride, gallium fluoride and gallium nitrate hydrate.

The tin compound used as the dispersoid of the sol solution may include at least one selected from the group consisting of tin acetate, tin chloride, tin chloride dihydrate, tin chloride pentahydrate and tin fluoride.

The thallium compound used as the dispersoid of the sol solution may include at least one selected from the group consisting of thallium acetate, thallium acetylacetonate, thallium chloride, thallium chloride tetrahydrate, thallium cyclopentadienide, thallium fluoride, thallium formate, thallium hexafluoroacetylacetonate, thallium nitrate, thallium nitrate trihydrate, thallium trifluroacetate and thallium perchlorate hydrate.

The hafnium compound used as the dispersoid of the sol solution may include at least one selected from the group consisting of hafnium chloride and hafnium fluoride.

The magnesium compound used as the dispersoid of the sol solution may include at least one selected from the group consisting of magnesium acetate, magnesium chloride, magnesium nitrate hydrate and magnesium sulfate.

The zirconium compound used as the dispersoid of the sol solution may include at least one selected from the group consisting of zirconium acetate, zirconium acetylacetonate, zirconium chloride and zirconium fluoride.

The yttrium compound used as the dispersoid of the sol solution may include at least one selected from the group consisting of yttrium acetate, yttrium acetylacetonate, yttrium chloride, yttrium fluoride and yttrium nitrate.

When the sol solution is formed, a sol stabilizer may be added to the disperse system. The sol stabilizer may include mono-ethanolamine, di-ethanolamine or tri-ethanolamine. The sol stabilizer may be mixed to have the same moles as the compound material of the dispersoid in the disperse system.

Moreover, when the sol solution is formed, acid or base may be added to the disperse system to adjust a potential of hydrogen (pH) of the disperse system. For example, the potential of hydrogen (pH) of the disperse system may be lowered if acetic acid ($CH_3COOH$) is added to the disperse system, and the potential of hydrogen (pH) of the disperse system may be heightened if a base (e.g., ammonium hydroxide, potassium hydroxide or sodium hydroxide) is added to the disperse system. Thus, the potential of hydrogen (pH) of the disperse system may be appropriately adjusted within the range of about 1 to 10 by adding the acid (e.g., acetic acid) or the base to the disperse system. In the present exemplary embodiment, the acid may be added to the disperse system such that the disperse system has the potential of hydrogen (pH) less than 7, and the acid component in the sol solution may be used in growth of the nano-structures in a subsequent process. Particularly, the potential of hydrogen (pH) of the disperse system may be adjusted of about 3.8 to 4.2.

Figure 11:
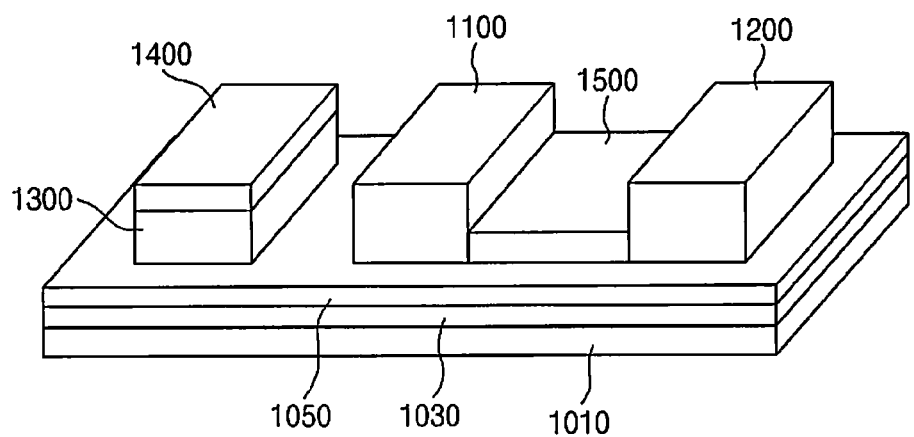

Referring to FIG. 11, the oxide semiconductor based sol solution (e.g., zinc oxide based sol solution) prepared by the above method may be provided on a surface of the gate insulation layer 1050 on the substrate 1010 to form an oxide semiconductor layer 1500 of a first conductivity type (an N-type in the present embodiment) on a portion of the gate insulation layer 1050. This oxide semiconductor layer 1500 may be formed between the first and second source/drain electrodes 1100 and 1200 to contact both the first and second source/drain electrodes 1100 and 1200. The oxide semiconductor layer 1500 may be formed by drying and heating a sol solution provided on the gate insulation layer 1050 to transform the sol solution into an oxide semiconductor thin film through a gelled pattern.

An oxide semiconductor layer of a multi-component system may be formed according to appropriate selection of a disperse system in a step of preparing a sol solution, and various and diverse oxide semiconductor layers may be formed by selecting a desired sol material. When the sol-gel process is used in formation of the oxide semiconductor thin film, various thin films having different compositions can be fabricated within a short time and electrical characteristics of the thin films can be easily controlled. Further, phases of the thin films can be easily changed by varying temperature and/or process time of a thermal treatment for transforming the sol solution into a gelled pattern. The oxide semiconductor layer 1500 may be used as a semiconductor channel region of the MOS transistors constituting the CMOS circuit, and a characteristic of the semiconductor channel region may be varied by changing the phase of the thin film or material as described above.

Figure 12:
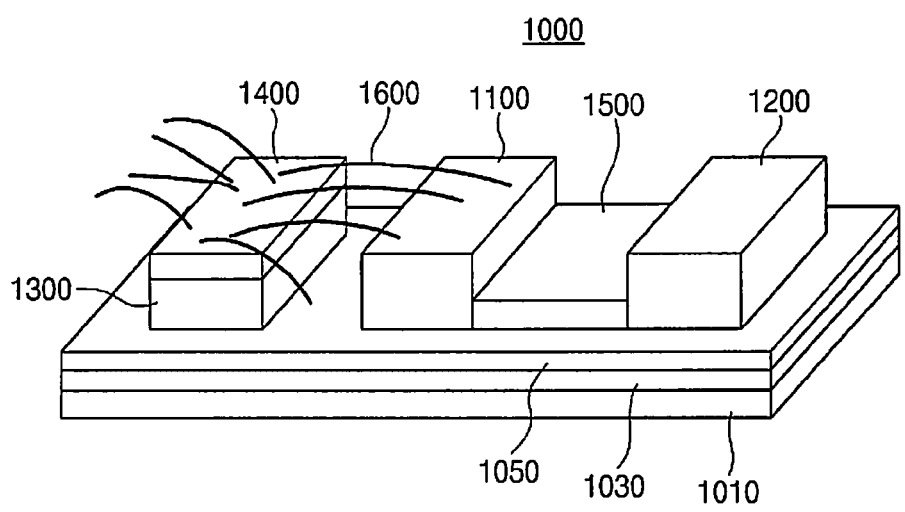

Referring to FIG. 12, acid may be supplied onto the copper layer 1400 acting as a seed layer and a thermal treatment may be applied to the copper layer 1400 on which the acid is supplied. As a result, copper oxide nano-structures, particularly, copper oxide (CuO) nano-wires 1600 may be grown from the copper layer 1400. As illustrated in FIG. 12, the copper oxide (CuO) nano-wires 1600 may be grown and at least some of the copper oxide (CuO) nano-wires 1600 may be formed to contact the first source/drain electrode 1100. As such, the CuO nano-wires 1600 may electrically connect the copper layer 1400 to the first source/drain electrode 1100, thereby acting as channels connecting the first and third source/drain electrodes 1100 and 1300 to each other. In particular, since the grown CuO nano-wires 1600 correspond to P-type semiconductors, the CuO nano-wires 1600 may act as P-channels between the first and third source/drain electrodes 1100 and 1300. In contrast, the oxide semiconductor layer 1500 may correspond to an N-type semiconductor. Thus, the oxide semiconductor layer 1500 may act as an N-channel between the first and second source/drain electrodes 1100 and 1200. Accordingly, the device illustrated in FIG. 12 may be a CMOS device. That is, the first source/drain electrode 1100, the N-type oxide semiconductor layer 1500 and the second source/drain electrode 1200 may constitute an N-channel MOSFET, and the third source/drain electrode 1300, the P-type CuO nano-wires 1600 and the first source/drain electrode 1100 may constitute a P-channel MOSFET.

As described above, if a thermal treatment is applied to the copper layer 1400 after acid is supplied onto the copper layer 1400, P-type CuO nano-wires 1600 may be obtained from the copper layer 1400. The thermal treatment for growth of the CuO nano-wires 1600 may be performed at a temperature of about 300° C. to about 1000° C. Further, the thermal treatment for growth of the CuO nano-wires 1600 may be performed in vacuum. The thermal treatment may be performed using at least one of a nitrogen gas, a hydrogen gas and an oxygen gas as an ambient gas. As such, the CuO nano-wires 1600, which are grown by a thermal treatment applied to the copper layer with acid, may be formed to be self-aligned with desired positions even without use of complicated processes such as separation, refinement and arrangement of the nano-structures. That is, the at least some of the CuO nano-wires 1600 may be grown from the copper layer 1400 to contact the first source/drain electrode 1100. Thus, according to the present embodiment, the nano-structures may be formed at desired positions even without use of a photolithography process. The nano-structures (corresponding to the CuO nano-wires in the present embodiment), which are grown by a thermal treatment applied to the copper layer with acid, may not include any catalyst components remained at ends thereof. That is, the nano-structures according to the present embodiment may not be contaminated with any metal catalysts, unlike the nano-structures fabricated using a catalyst. Thus, it may be possible to apply single crystalline pure nano-structures without contamination to electronic devices.

In the present embodiment described above, the acid supplied onto the copper layer 1400 for growth of the CuO nano-wires may be provided in the form of sol solution having a pH less than 7. In this case, while the sol solution is gelled, the N-type oxide semiconductor layer 1500 and the CuO nano-wires 1600 may be simultaneously formed. That is, the oxide semiconductor based sol solution containing acid may be provided onto a portion of the gate insulation layer 1050 (between the first and second source/drain electrodes 1100 and 1200) as well as the copper layer 1400. Subsequently, the sol solution may be gelled using a thermal treatment, thereby forming the N-type oxide semiconductor layer 1500 on an N-channel region between the first and second source/drain electrodes 1100 and 1200 as well as the CuO nano-wires 1600 extending from the copper layer 1400 onto the first source/drain electrode 1100. The phase of the oxide semiconductor layer 1500 and/or the sizes, lengths or electrical characteristics of the CuO nano-wires 1600 may be controlled by changing the temperature and process time of the thermal treatment.

The above exemplary embodiment is described in conjunction with CMOS devices and fabrication processes thereof. However, the inventive concept is not limited to the CMOS devices and fabrication process thereof. For example, the inventive concept may be applied to MOSFETs, PN junction diodes, JFETs or the like.

Figure 13:
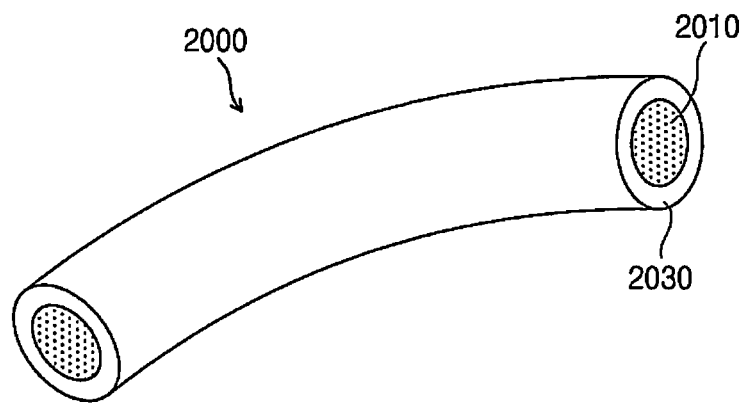
FIG. 13 is a perspective view illustrating an oxide semiconductor device according to another exemplary embodiment.

FIG. 13 illustrates an oxide semiconductor device 2000 including a CuO nano-structure according to another exemplary embodiment. Referring to FIG. 13, the oxide semiconductor device 2000 may include a CuO nano-wire 2010 having a P-type semiconductor and an N-type oxide semiconductor layer 2030 surrounding an outer circumference of the nano-wire 2010. The oxide semiconductor device 2000 may have a P-N junction formed by the P-type nano-wire 2010 and the N-type oxide semiconductor layer 2030. The CuO nano-wire 2010 may be obtained through the chemical reaction of the copper layer on the acid and the thermal treatment applied to the copper layer, as described above. Further, the N-type oxide semiconductor layer 2030 may be obtained by transforming the oxide semiconductor based sol solution into a gelled material. That is, the N-type oxide semiconductor layer 2030 may be obtained by supplying a sol solution onto the outer circumference of the nano-wire 2010 and heating the sol solution to form a thin film having an N-type semiconductor property. As a result, the N-type oxide semiconductor layer 2030 and the P-type nano-wire 2010 may constitute a diode having a P-N junction.

The oxide semiconductor device 2000 illustrated in FIG. 13 may be used as a P-N diode. Further, in the event that additional electrodes are formed on the oxide semiconductor device 2000, a JFET can be obtained (refer to FIG. 14). Moreover, the fabrication process of the oxide semiconductor device 2000 may be used in growth of CuO nano-structures distributed on a substrate having a large area and in deposition of thin films using a sol-gel process. That is, the fabrication process of the oxide semiconductor device 2000 may be used in formation of solar cells.

Figure 14A:
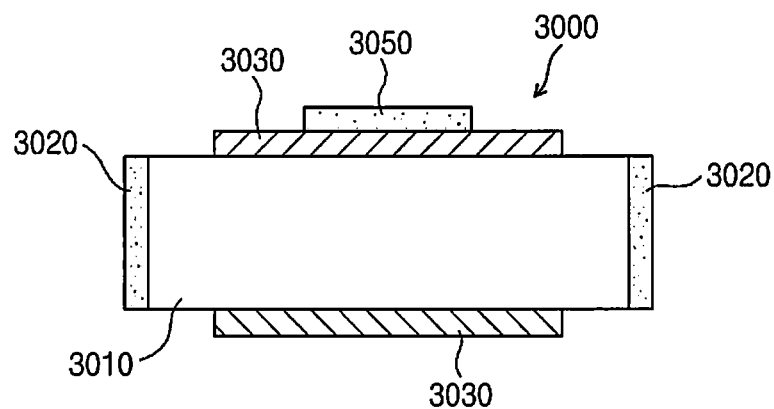
FIGS. 14A and 14B are cross sectional views illustrating an oxide semiconductor device according to yet another exemplary embodiment.
Figure 14B:
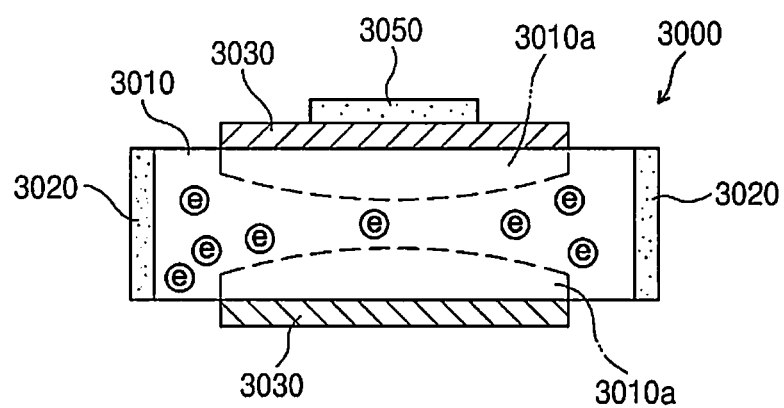

FIGS. 14A and 14B illustrate an oxide semiconductor device 3000 including CuO nano-structures fabricated according to yet another exemplary embodiment. FIG. 14A is a cross sectional view illustrating the oxide semiconductor device 3000, and FIG. 14B is a cross sectional view illustrating operation principles of the oxide semiconductor device 3000.

Referring to FIG. 14A, the oxide semiconductor device 3000 may include a P-type CuO nano-wire 3010, an N-type oxide semiconductor layer 3030 surrounding an outer surface of the P-type CuO nano-wire 3010, source/drain electrodes 3020 formed on both ends of the P-type CuO nano-wire 3010, and a gate electrode 3050 formed on the N-type oxide semiconductor layer 3030. This oxide semiconductor device 3000 may act as one of JFETs. That is, the oxide semiconductor device 3000 may operate as a transistor.

Referring to FIG. 14B, a width of a depletion region 3010a formed in the P-type CuO nano-wire 3010 may be adjusted according to a voltage (e.g., a gate voltage) applied to the gate electrode 3050. The width of a depletion region 3010a may control a cross sectional area of an effective channel region corresponding to the central region of the CuO nano-wire 3010, which is surrounded by the depletion region 3010a. Thus, a current flowing through the effective channel region between the source/drain electrodes 3020 may be controlled by the gate voltage.

Figure 15:
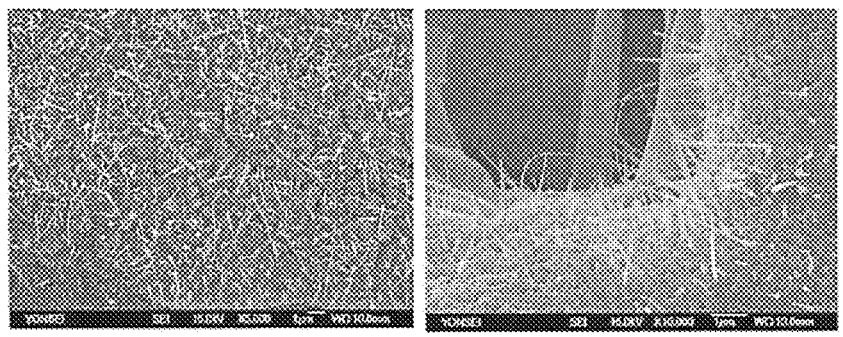
FIG. 15 is a scanning electron microscope (SEM) picture illustrating P-type copper oxide nano-wires that can be applied to an oxide semiconductor device fabricated according to an exemplary embodiment.

FIG. 15 is a scanning electron microscope (SEM) picture illustrating copper oxide (CuO) nano-wires grown through a chemical reaction of copper on acid and thermal treatment applied to the copper. The CuO nano-wires illustrated in FIG. 15 are P-type semiconductors that can be applied to an oxide semiconductor device fabricated according to an exemplary embodiment. The CuO nano-wires grown from a copper grid may have a diameter of about several hundred nanometers and a length of about several hundred nanometers to several micrometers. The CuO nano-wires may be formed without any contamination due to metal catalysts, unlike the nano-structures fabricated using a metal catalyst. That is, the CuO nano-wires may be formed to have pure semiconductor nano-structures without metal components bonded to ends of the nano-structures. Thus, <Methods of Fabricating an Oxide Nano-Structure Using a Sol-Gel Process and a Porous Nano-Structure>

Various nano-structures may be formed using a vapor-liquid-solid (VLS) mechanism, a vapor-solid (VS) mechanism, a solution-liquid-solid (SLS) mechanism or the like.

A metal catalyst may be required to fabricate the nano-structures using the VLS mechanism, and the metal catalyst may include metal (e.g., gold (Au), nickel (Ni) or iron (Fe)), which is capable of lowering a melting point of a material. In this VLS mechanism, the position and the size of the catalyst may control the position and the diameter of the nano-structures. The nano-structures fabricated using the VLS mechanism may have a high quality of crystallinity.

For instance, a typical prior art for obtaining a silicon nano-structure using the VLS mechanism is disclosed in an article (a first reference article) by Lincoln J. Lauhon et al., entitled "Expitaxial core-shell and core-multishell narrowire heterostructures", Nature 420, 57 (2002). According to the first reference article, gaseous reactants may be combined with gold (on gold nano-cloud surfaces) acting as catalysts to generate nuclei and the nuclei may grow to form silicon nano-structures having a multi shell While the silicon nano-structures are formed, the gold may act as a catalyst. The gold may lower a melting point of silicon so that the gold and the silicon are easily alloyed with each other in a liquid state. This can be seen from a phase diagram of silicon and iron (Fe). That is, if a metal catalyst is used in fabrication of nano-structures, the metal catalyst may remain at ends of the nano-structures. This may correspond to a method of forming nano-structures using the VLS mechanism.

The VLS mechanism described above may be a typical method used not only in formation of the silicon nano-structure but also in formation of a one dimensional nano-structure such as Ge, ZnO, ZnSe, GaAs, GaP, GaN, InP, CdS or CdSe (refer to a second reference article by Younan Xia et al., entitled "One Dimensional Nano-structures: Synthesis, Characterization, and Application", Advanced Material, 15, 353 (2003)).

Meanwhile, in order to fabricate nan-structures using the SLS mechanism, a liquid precursor and a catalyst such as gold may be required. The gold acting as the catalyst may increase overall yield of the nano-structures or may control the diameter and the location of the nano-structures. That is, the nano-structures fabricated using the SLS mechanism may be grown at a relatively low temperature as compared with the nano-structures fabricated using the VLS mechanism. Thus, the crystallinity of the nano-structures fabricated using the SLS mechanism may be degraded as compared with the crystallinity of the nano-structures fabricated using the VLS mechanism.

For instance, a typical prior art for obtaining a silicon nano-structure using the SLS mechanism is disclosed in an article (a third reference article) by Xianmao Lu et al., entitled "Growth of Single Crystal Silicon Narrowires in Supercritical Sliution from Tethered Gold Particles on a Silicon Substrate", Nano letters, 3, 93 (2003). According to the third reference article, gold nano-particles, $(C_6H_5)_2SiH_2$ and hexane may be used as a metal catalyst, a silicon liquid precursor and a solvent, respectively. In this case, the $(C_6H_5)_2SiH_2$ may be decomposed into silicon atoms and the silicon atoms may be alloyed with the gold nano-particles in a liquid state to extract silicon. As a result, silicon nano-structures may be formed. The metal catalyst may control the diameter of the nano-structures and may control the location of the nano-structures.

Meanwhile, the conventional method of fabricating a zinc oxide nano-structure will now be described. This conventional method may be performed using a metal catalyst, a sol-gel process without a vapor, and an extraction technique. Specifically, zinc nitrate is dissolved in de-ionized water to form a zinc nitride solution, and ammonium carbide is dissolved in de-ionized water to form an ammonium carbide solution. The zinc nitride solution may be slowly dropped onto the ammonium carbide solution and the mixture may be stirred to extract. The extracted material may be filtered and rinsed using de-ionized water to remove remnants. Subsequently, the resultant may be again dipped into de-ionized water and stirred for about five minutes. The floating materials may be put in a Teflon-lined autoclave having a capacity of 100 milli-liters and a hydrothermal synthesis may be performed from about 130° C. to about 200° C. Subsequently, the resultant may be rinsed using alcohol and may be dried at a temperature of about 90° C. for twelve hours to obtain a zinc oxide nano-structure.

The other conventional method of fabricating a zinc oxide nano-structure will now be described. According to this conventional method, aligned zinc oxide nano-structures may be formed using an anodic aluminum oxide (AAO) material. Specifically, AAO porous nano-structures are formed, and contaminants and a barrier layer are removed using an $HgCl_2$ solution and a phosphoric acid solution. Gold may be then deposited on the AAO using a sputtering process. Growth of nano-structures may be performed in a tube furnace. The AAO porous nano-structures may be coated by zinc. Subsequently, a thermal treatment may be performed at a temperature of about 800° C. to about 900° C. using an argon gas as an ambient gas, thereby completely evaporating the zinc. Finally, performance of the thermal treatment and injection of the argon gas are stopped, and an oxygen gas is then injected to form zinc oxide nano-structures.

However, according to the aforementioned prior arts, the nano-structures are formed using a deposition process with a high priced vacuum apparatus and a catalyst. Thus, the fabrication process may become complicated and the fabrication cost may be increased.

Accordingly, the exemplary embodiments provide methods of fabricating an oxide nano-structure by injecting an oxide material into a porous nano-structure using a sol-gel process. Thus, a metal oxide material of a multi-component system may be efficiently formed, and the oxide nano-structure may be formed to have a desired composition, a desired size and a desired phase.

The exemplary embodiment provides a method of fabricating metal oxide semiconductor nano-structures of a multi-component system using a sol-gel process and a porous template.

The exemplary embodiment may include a step of fabricating a sol material, a step of fabricating a porous template, a step of applying a surface treatment to the porous template, and a step of injecting an oxide material solution (e.g., a liquid oxide compound sol material) into the surface treated porous template. Subsequently, a thermal treatment may be performed and the porous template may be removed to form oxide nano-structures.

Composition of the nano-structures may be determined according to composition of the sol material, and the size of the oxide nano-structures may be adjusted according to a shape and a size of the porous template. Further, the shape of the oxide nano-structures may be determined according to a process condition of the surface treatment applied to the porous template. The phase of the nano-structures may be determined according to a temperature of the thermal treatment. According to the exemplary embodiment, oxide nano-structures of a multi-component system may be easily formed using a simplified process, and the size, shape and phase of the oxide nano-structures can be easily controlled.

That is, one of the features of the exemplary embodiments is to inject an oxide material solution into a porous nano-structure using a sol-gel process. Thus, the exemplary embodiments may be distinguished from a method of fabricating a nano-structure using a deposition process with a vacuum apparatus and a catalyst.

FIGS. 16 to 19 are schematic drawings illustrating a method of forming oxide nano-structures using a porous nano-structure and a sol-gel process according to an exemplary embodiment.

Figure 16:
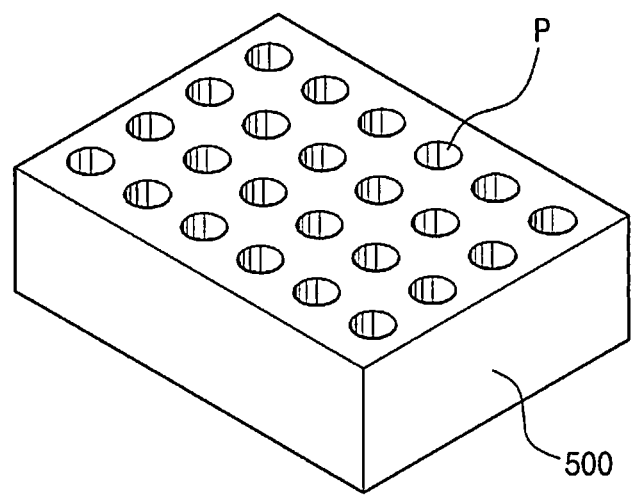
FIGS. 16 to 19 are schematic drawings illustrating a method of forming oxide nano-structures using a porous nano-structure and a sol-gel process according to an exemplary embodiment.
Figure 16:
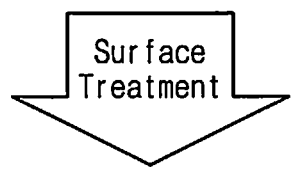
Figure 16:
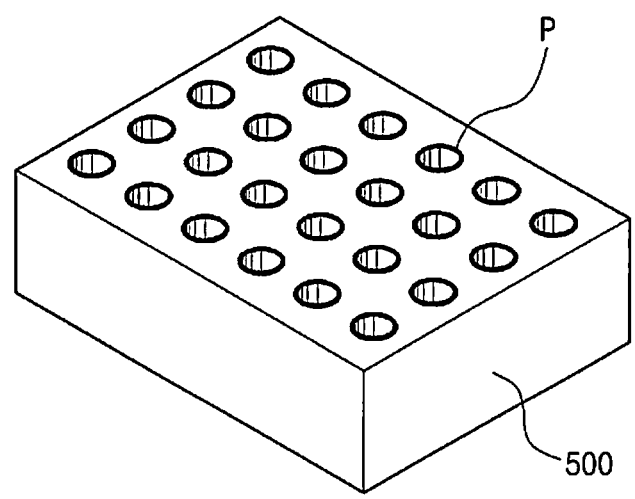

Referring to FIG. 16, a substrate 500 having a porous template, for example, porous nano-structures P may be provided. A surface treatment may be applied to the substrate 500 using a physical method or a chemical method. The substrate 500 having the porous nano-structures P may preferably include an anodic aluminum oxide (AAO) material or an acrylamide (AAM) material.

The chemical method utilized as the surface treatment may be performed using a chemical solution, for example, a piranha solution, a mixture of de-ionized water and acetone, a toluene material or an octadecyltetrachlorosilane-self-assembled-monolayers (OTS-SAMs) material. Surfaces of the porous nano-structures P treated by any one of the above listed chemical solutions may have viscosity to a metal oxide solution of a multi-component system. Thus, the metal oxide solution may be easily injected into the porous nano-structures P in a subsequent process. The physical method may be performed by stirring the chemical solution or applying an ultrasonic process to the substrate together with the chemical solution.

For instance, before a metal oxide solution such as a liquid oxide compound sol solution (600 of FIG. 17) is injected into the porous nano-structures P including the anodic aluminum oxide (AAO) material, the surface treatment may be applied to the substrate having the porous nano-structures P. The surface treatment may allow the liquid oxide compound sol solution 600 to be smoothly injected into the porous nano-structures P. That is, if the surface treatment is not performed successfully, the liquid oxide compound sol solution 600 may not be smoothly injected into the porous nano-structures P. It is preferable that the surface treatment is applied to the porous nano-structures P using an appropriate chemical reaction for an appropriate process time.

Figure 17:
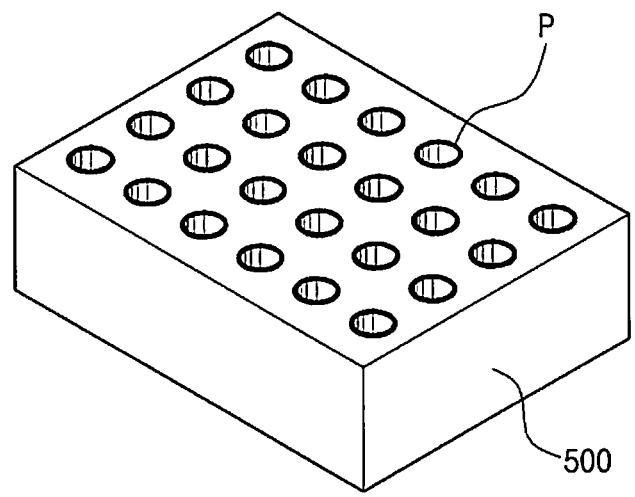
Figure 17:
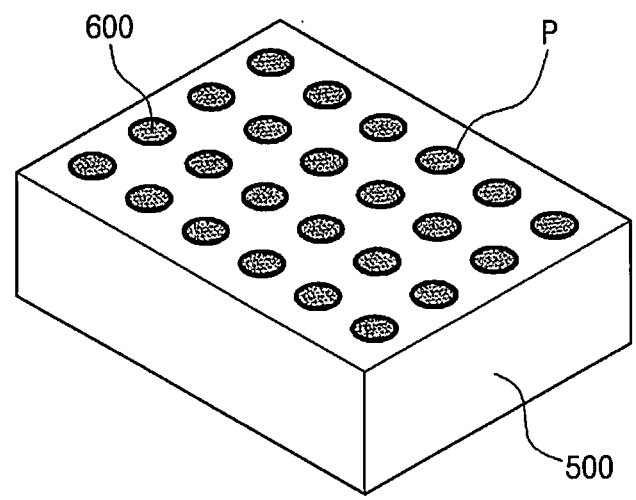

Referring to FIG. 17, the oxide compound sol solution 600 may be injected into the surface treated porous nano-structures P. For example, an In—Ga—ZnO (IGZO) solution corresponding to the oxide compound sol solution 600 may be injected into the surface treated anodic aluminum oxide (AAO) porous nano-structures P. The IGZO solution may be preferably injected using a dip coating method. However, the method of injecting the IGZO solution is not limited to the dip coating method. For example, the IGZO solution may be injected using a spin coating method.

If the IGZO solution is injected using the spin coating method after the surface treatment, the IGZO solution may be deposited only on a top surface of substrate 500 and may not be injected into the porous nano-structures P. This may be due to centrifugal force which is generated by rotation of the substrate during the spin coating process. This effect may still cause even though the spin coating process is performed with low revolutions per minute (RPM) thereof.

However, in the event that the RPM of the spin coating process is very low, the IGZO solution may be injected into the porous nano-structures P because the centrifugal force applied to the IGZO solution is remarkably reduced. However, in an exemplary embodiment, the IGZO solution may be injected into the porous nano-structures P using a dip coating process. The dip coating process may be performed by dipping the substrate including the surface treated anodic aluminum oxide (AAO) porous nano-structures P into a vessel filled with the IGZO solution.

The important parameters of the dip coating process may be an atmospheric pressure and a process temperature. For example, the dip coating process may be performed at a temperature of about 100° C. in vacuum. Preferably, the oxide compound sol solution 600 may be injected into the porous nano-structures P at a temperature of about 80° C. to about 100° C. under a vacuum condition of about $1 \times 10^{-1}$ torr to about $1 \times 10^{-7}$ torr.

In the dip coating process, creating the temperature of about 100° C. is for increasing the viscosity of the substrate surface to the IGZO solution below a temperature at which the IGZO solution loses its own property, and creating the vacuum condition is for removing air in the anodic aluminum oxide (AAO) porous nano-structures P to smoothly injecting the IGZO solution into the porous nano-structures P without any voids. That is, the dip coating process may be performed using a capillary phenomenon. Thus, the oxide nano-structures injected into the porous nano-structures P may have a uniform size and composition.

In the meantime, the oxide compound sol solution 600 may be formed by mixing dispersoid in the corresponding dispersion medium to form a disperse system, stirring the disperse system, and aging the stirred disperse system. The dispersoid may include at least two compound materials selected from the group consisting of a zinc compound, an indium compound, a gallium compound, a tin compound, a hafnium compound, a zirconium compound, a magnesium compound, an yttrium compound and a thallium compound. The dispersoid may be formed by mixing the zinc compound and a non-zinc compound (e.g., at least one of the indium compound, the gallium compound, the tin compound, the hafnium compound, the zirconium compound, the magnesium compound, the yttrium compound and the thallium compound) in a mole ratio of about 1:0.1 to about 1:2.

The dispersion medium may include at least one selected from the group consisting of isopropanol, 2-methoxyethanol, dimethylformamide, ethanol, de-ionized water, methanol, acetylacetone, dimethylamineborane and acetonitrile.

The zinc compound may include at least one selected from the group consisting of zinc citrate dihydrate, zinc acetate, zinc acetate dihydrate, zinc acetylacetonate hydrate, zinc acrylate, zinc chloride, zinc diethyldithiocarbamate, zinc dimethyldithiocarbamate, zinc fluoride, zinc fluoride hydrate, zinc hexafluoroacetylacetonate dihydrate, zinc methacrylate, zinc nitrate hexahydrate, zinc nitrate hydrate, zinc trifluoromethanesulfonate, zinc undecylenate, zinc trifluoroacetate hydrate, zinc tetrafluoroborate hydrate and zinc perchlorate hexahydrate.

Further, the indium compound may include at least one selected from the group consisting of indium chloride, indium chloride tetrahydrate, indium fluoride, indium fluoride trihydrate, indium hydroxide, indium nitrate hydrate, indium acetate hydrate, indium acetylacetonate and indium acetate.

The gallium compound may include at least one selected from the group consisting of gallium acetylacetonate, gallium chloride, gallium fluoride and gallium nitrate hydrate.

The tin compound may include at least one selected from the group consisting of tin acetate, tin chloride, tin chloride dihydrate, tin chloride pentahydrate and tin fluoride.

The thallium compound may include at least one selected from the group consisting of thallium acetate, thallium acetylacetonate, thallium chloride, thallium chloride tetrahydrate, thallium cyclopentadienide, thallium fluoride, thallium formate, thallium hexafluoroacetylacetonate, thallium nitrate, thallium nitrate trihydrate, thallium trifluroacetate and thallium perchlorate hydrate.

Further, a molar concentration of the zinc compound, the indium compound, the gallium compound, the tin compound or the thallium compound in the disperse system may be about 0.1 mol/l (M) to about 10 mol/l (M).

When the sol solution is formed, a sol stabilizer may be added to the disperse system. The sol stabilizer may be added to have the same moles as the zinc compound material. The sol stabilizer may include at least one of mono-ethanolamine, di-ethanolamine and tri-ethanolamine.

Moreover, when the sol solution is formed, acid or base may be added to the disperse system to adjust a potential of hydrogen (pH) of the disperse system. For example, the potential of hydrogen (pH) of the disperse system may be lowered if acetic acid ($CH_3COOH$) is added to the disperse system, and the potential of hydrogen (pH) of the disperse system may be heightened if a base (e.g., ammonium hydroxide, potassium hydroxide or sodium hydroxide) is added to the disperse system. Thus, the potential of hydrogen (pH) of the disperse system may be appropriately adjusted within the range of about 1 to 10 by adding the acid (e.g., acetic acid) or the base to the disperse system. More preferably, the potential of hydrogen (pH) of the disperse system may be adjusted of about 3.8 to 4.2.

Figure 18:
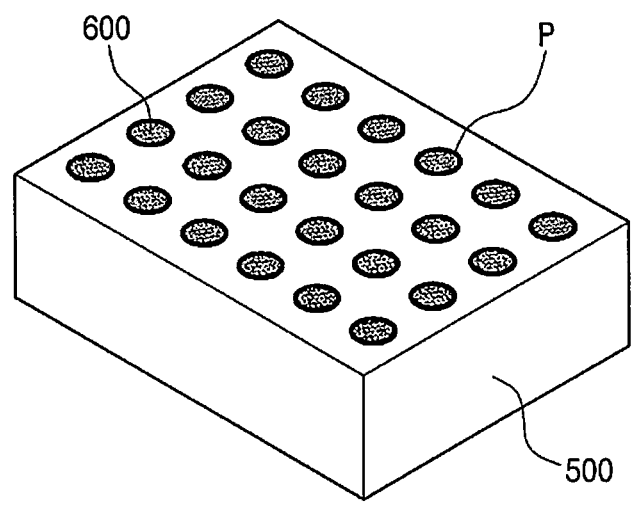
Figure 18:
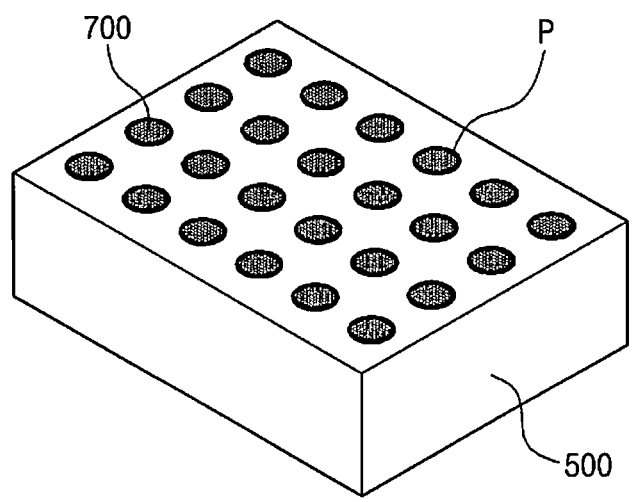

Referring to FIG. 18, the oxide compound sol solution 600 injected into the porous nano-structures P may be dried and heated using a thermal treatment process to transform the oxide compound sol solution 600 into gelled patterns. As a result, oxide nano-structures 700 may be formed in respective ones of the porous nano-structures P. Preferably, the thermal treatment process may be performed at a temperature of about 300° C. to about 1000° C.

For instance, the thermal treatment process for curing the oxide compound sol solution 600 may be performed using an oxygen gas as an ambient gas.

Figure 20:
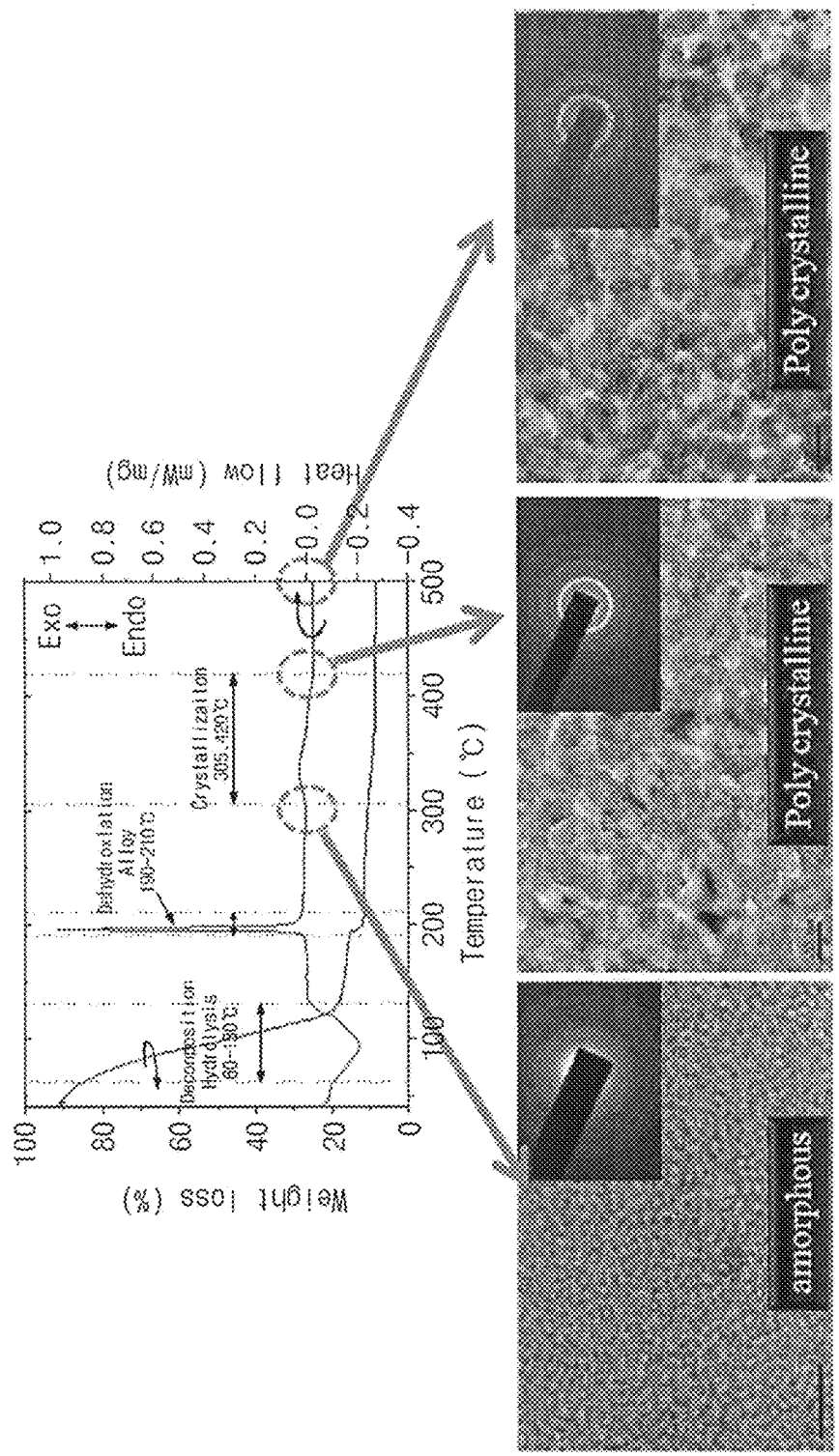
FIG. 20 is a merged drawing including a TG-DSC measurement graph of IGZO solution and transmission electron microscope (TEM) pictures of phases of IGZO materials cured at various temperatures.

FIG. 20 is a merged drawing including a TG(thermo-gravimetric analysis)-DSC(differential scanning calorimetry) measurement graph of an IGZO solution and transmission electron microscope (TEM) pictures of phases of IGZO materials cured at various temperatures. In the IGZO solution, a composition ratio of indium, gallium and zinc was 1:1:2.

Referring to FIG. 20, the dispersion medium, i.e., a solvent may be decomposed at a temperature lower than about 150° C., and the decomposed elements may be combined with each other at a temperature of about 200° C. to form an oxide compound material. Further, the oxide compound material, i.e., the IGZO material may be crystallized at a temperature within the range of about 305° C. to about 420° C. Three TEM pictures in FIG. 20 illustrate phases of IGZO materials cured at temperatures of 300° C., 400° C. and 500° C., respectively.

As can be seen from the TEM pictures, the IGZO materials had a phase corresponding to an amorphous state at a temperature below the crystallization temperature and a phase corresponding to a polycrystalline state at a temperature over the crystallization temperature. Thus, the TEM pictures were consistent with the TG-DSC measurement results illustrated in the graph. The TG-DSC measurement results were hardly changed even though the composition ratio of the IGZO material was varied. The IGZO nano-structures may be obtained through the curing process, for example, a thermal treatment process.

As described in the above exemplary embodiment, the oxide nano-structures may be obtained by injecting the oxide material solution, for example, the oxide compound sol solution 600 into the anodic aluminum oxide (AAO) porous nano-structures P. This method may have advantages which are capable of obtaining the nano-structures using a metal oxide solution of a multi-component system and capable of easily changing the size and shape of the nano-structures according to the process condition of the anodic aluminum oxide (AAO). Further, as illustrated in FIG. 20, the phase of the oxide nano-structures formed in the anodic aluminum oxide (AAO) porous nano-structures P may be changed by controlling the curing temperature. Furthermore, the nano-structures may be formed to have a desired composition by changing a composition of an oxide material solution during fabrication of the oxide material solution.

Figure 19:
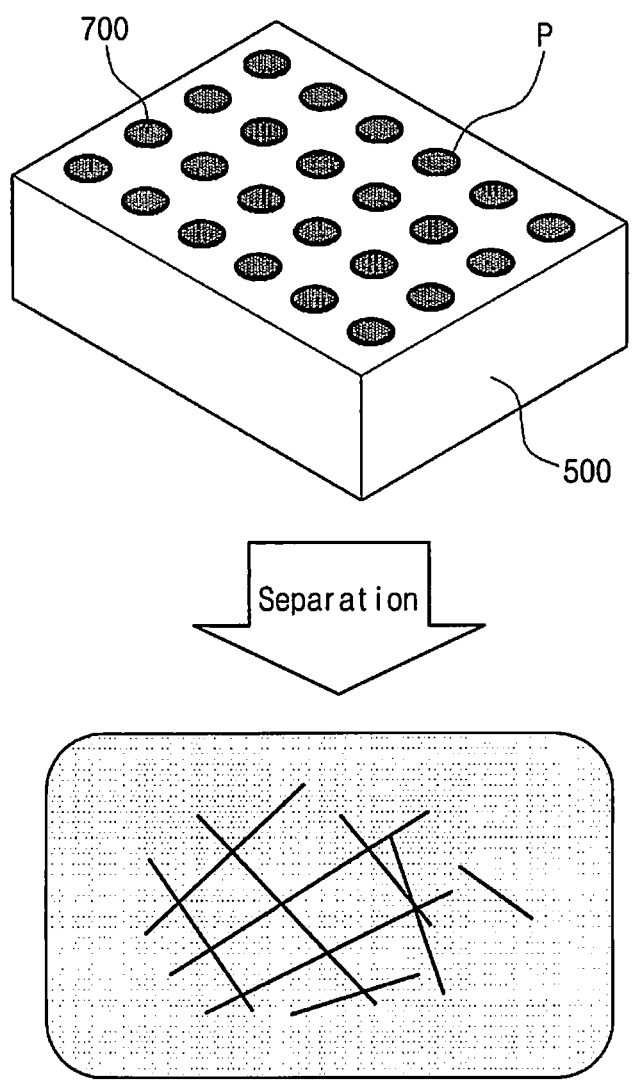

Referring to FIG. 19, the oxide nano-structures 700 and the porous nano-structures P may be separated from each other. The separation of the oxide nano-structures 700 and the porous nano-structures P may include etching the porous nano-structures P using an etchant such as a sodium hydroxide solution and obtaining the oxide nano-structures 700 using a centrifugal separation process.

In the meantime, shapes of the oxide nano-structures 700 may be determined by shapes of the porous nano-structures P. For example, the oxide nano-structures 700 may be formed to have a dot shape or a cylindrical shape, and the oxide nano-structures 700 may be formed to have a size of about several nanometers to about several micrometers.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

INDUSTRIAL APPLICABILITY

The exemplary embodiments of the inventive concept may be applied to methods of fabricating electronic devices, thin film transistors (TFTs), liquid crystal display devices employing the TFTs, memory transistors or memory devices with a sol-gel process.

What is claimed is:

1. A composition for an oxide thin film, comprising:
   a zinc compound; and
   at least one non-zinc compound selected from the group consisting of a hafnium compound, a zirconium compound, a magnesium compound, and an yttrium compound,
   wherein a mole ratio of the zinc compound to the at least one non-zinc compound is about 1:0.1 to about 1:2,
   wherein a molar concentration of the zinc compound, the hafnium compound, the zirconium compound, the magnesium compound or the yttrium compound is about 0.1 mol/l (M) to about 10 mol/l (M).

2. The composition according to claim 1, wherein the zinc compound is selected from the group consisting of zinc citrate dihydrate, zinc acetate, zinc acetate dihydrate, zinc acetylacetonate hydrate, zinc acrylate, zinc chloride, zinc diethyldithiocarbamate, zinc dimethyldithiocarbamate, zinc fluoride, zinc fluoride hydrate, zinc hexafluoroacetylacetonate dihydrate, zinc methacrylate, zinc nitrate hexahydrate, zinc nitrate hydrate, zinc trifluoromethanesulfonate, zinc undecylenate, zinc trifluoroacetate hydrate, zinc tetrafluoroborate hydrate, zinc perchlorate hexahydrate, and combinations thereof.

3. The composition according to claim 1, wherein the hafnium compound is selected from the group consisting of hafnium chloride, hafnium fluoride, and combinations thereof.

4. The composition according claim 1, wherein the magnesium compound is selected from the group consisting of magnesium acetate, magnesium chloride, magnesium nitrate hydrate, magnesium sulfate, and combinations thereof.

5. The composition according to claim 1, wherein the zirconium compound is selected from the group consisting of zirconium acetate, zirconium acetylacetonate, zirconium chloride, zirconium fluoride, and combinations thereof.

6. The composition according to claim 1, wherein the yttrium compound is selected from the group consisting of yttrium acetate, yttrium acetylacetonate, yttrium chloride, yttrium fluoride, yttrium nitrate, and combinations thereof.

7. The composition according to claim 1, further comprising at least two selected from the group consisting of isopropanol, 2-methoxyethanol, dimethylformamide, ethanol, de-ionized water, methanol, acetylacetone, dimethylamineborane and acetonitrile to disperse the compounds.

8. The composition according to claim 1, further comprising a stabilizer selected from the group consisting of mono-ethanolamine, di-ethanolamine, tri-ethanolamine, and combinations thereof.

9. A composition for an oxide thin film, comprising:
  a zinc compound;
  at least one non-zinc compound selected from the group consisting of a hafnium compound, a zirconium compound, a magnesium compound, and an yttrium compound; and
  at least one non-zinc compound selected from the group consisting of an indium compound, a gallium compound, a tin compound, and a thallium compound,
  wherein a mole ratio of the zinc compound to at least one of the hafnium compound, the zirconium compound, the magnesium compound, the yttrium compound, the indium compound, the gallium compound, the tin compound, and the thallium compound is about 1:0.1 to about 1:2,
  wherein a molar concentration of the zinc compound, the hafnium compound, the zirconium compound, the magnesium compound, or the yttrium compound is about 0.1 mol/l (M) to about 10 mol/l (M).

10. The composition according to claim 9, wherein the indium compound is selected from the group consisting of indium chloride, indium chloride tetrahydrate, indium fluoride, indium fluoride trihydrate, indium hydroxide, indium nitrate hydrate, indium acetate hydrate, indium acetylacetonate, indium acetate, and combinations thereof.

11. The composition according to claim 9, wherein the gallium compound is selected from the group consisting of gallium acetylacetonate, gallium chloride, gallium fluoride, gallium nitrate hydrate, and combinations thereof.

12. The composition according to claim 9, wherein the tin compound is selected from the group consisting of tin acetate, tin chloride, tin chloride dihydrate, tin chloride pentahydrate, tin fluoride, and combinations thereof.

13. The composition according to claim 9, wherein the thallium compound is selected from the group consisting of thallium acetate, thallium acetylacetonate, thallium chloride, thallium chloride tetrahydrate, thallium cyclopentadienide, thallium fluoride, thallium formate, thallium hexafluoroacetylacetonate, thallium nitrate, thallium nitrate trihydrate, thallium trifluroacetate, thallium perchlorate hydrate, and combinations thereof.

14. The composition according to claim 9, wherein the zinc compound is selected from the group consisting of zinc citrate dihydrate, zinc acetate, zinc acetate dihydrate, zinc acetylacetonate hydrate, zinc acrylate, zinc chloride, zinc diethyldithiocarbamate, zinc dimethyldithiocarbamate, zinc fluoride, zinc fluoride hydrate, zinc hexafluoroacetylacetonate dihydrate, zinc methacrylate, zinc nitrate hexahydrate, zinc nitrate hydrate, zinc trifluoromethanesulfonate, zinc undecylenate, zinc trifluoroacetate hydrate, zinc tetrafluoroborate hydrate, zinc perchlorate hexahydrate, and combinations thereof.

15. The composition according to claim 9, wherein the hafnium compound is selected from the group consisting of hafnium chloride, hafnium fluoride, and combinations thereof.

16. The composition according claim 9, wherein the magnesium compound is selected from the group consisting of magnesium acetate, magnesium chloride, magnesium nitrate hydrate, magnesium sulfate, and combinations thereof.

17. The composition according to claim 9, wherein the zirconium compound is selected from the group consisting of zirconium acetate, zirconium acetylacetonate, zirconium chloride, zirconium fluoride, and combinations thereof.

18. The composition according to claim 9, wherein the yttrium compound is selected from the group consisting of yttrium acetate, yttrium acetylacetonate, yttrium chloride, yttrium fluoride, yttrium nitrate, and combinations thereof.

19. The composition according to claim 9, further comprising at least two selected from the group consisting of isopropanol, 2-methoxyethanol, dimethylformamide, ethanol, de-ionized water, methanol, acetylacetone, dimethylamineborane and acetonitrile to disperse the compounds.

20. The composition according to claim 9, further comprising a stabilizer selected from the group consisting of mono-ethanolamine, di-ethanolamine, tri-ethanolamine, and combinations thereof.

21. A method of forming an oxide thin film, comprising:
  coating a solution including at least one zinc compound and at least one non-zinc compound selected from the group consisting of a hafnium compound, a zirconium compound, a magnesium compound, and an yttrium compound,
  wherein a mole ratio of the at least one zinc compound to the at least one non-zinc compound is about 1:0.1 to about 1:2.

22. A method of forming an oxide thin film, comprising:
  coating a solution including:
    at least one zinc compound;
    at least one non-zinc compound selected from the group consisting of an indium compound, a gallium compound, a tin compound, and a thallium compound; and
    at least one non-zinc compound selected from the group consisting of a hafnium compound, a zirconium compound, a magnesium compound, and an yttrium compound,
    wherein a mole ratio of the zinc compound to at least one of the hafnium compound, the zirconium compound, the magnesium compound, the yttrium compound, the indium compound, the gallium compound, the tin compound, and the thallium compound is about 1:0.1 to about 1:2.

23. A method of fabricating a liquid solution for an oxide thin film, comprising:
  mixing at least one zinc dispersoid with at least one non-zinc dispersoid selected from the group consisting of a hafnium compound, a zirconium compound, a magnesium compound, and an yttrium compound in a dispersion medium corresponding to the selected dispersoids to form a disperse system,
  wherein a mole ratio of the zinc dispersoid to the at least one non-zinc dispersoid is about 1:0.1 to about 1:2.

24. The method according to claim 23, wherein a molar concentration of the zinc compound, the indium compound, the gallium compound, the tin compound, the hafnium compound, the zirconium compound, the magnesium compound, the yttrium compound or the thallium compound is about 0.1 mol/l (M) to about 10 mol/l (M).

25. A method of fabricating a liquid solution for an oxide thin film, comprising:
  mixing at least one zinc dispersoid with at least one non-zinc dispersoid selected from the group consisting of a hafnium compound, a zirconium compound, a magnesium compound, and an yttrium compound, and at least one non-zinc dispersoid selected from the group consisting of an indium compound, a gallium compound, a tin compound, and a thallium compound in a dispersion medium corresponding to the selected dispersoids to form a disperse system, wherein a mole ratio of the zinc dispersoid to at least one of the indium compound, the gallium compound, the tin compound, the hafnium compound, the zirconium compound, the magnesium compound, the yttrium compound and the thallium compound is about 1:0.1 to about 1:2.

26. The method according to claim 25, wherein a molar concentration of the zinc compound, the indium compound, the gallium compound, the tin compound, the hafnium compound, the zirconium compound, the magnesium compound, the yttrium compound or the thallium compound is about 0.1 mol/l (M) to about 10 mol/l (M).

* * * * *